United States Patent
Kubo

(10) Patent No.: US 8,816,318 B2
(45) Date of Patent: Aug. 26, 2014

(54) NONVOLATILE MEMORY DEVICE AND METHOD FOR MANUFACTURING SAME

(71) Applicant: Kabushiki Kaisha Toshiba, Tokyo (JP)

(72) Inventor: Koichi Kubo, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 13/779,716

(22) Filed: Feb. 27, 2013

(65) Prior Publication Data

US 2013/0248807 A1    Sep. 26, 2013

(30) Foreign Application Priority Data

Mar. 24, 2012  (JP) .................. 2012-068498

(51) Int. Cl.
*H01L 47/00*      (2006.01)
(52) U.S. Cl.
USPC ............................................. 257/4; 438/382
(58) Field of Classification Search
USPC ............................................. 257/4; 438/382
See application file for complete search history.

(56) References Cited

U.S. PATENT DOCUMENTS

| | | |
|---|---|---|
| 2005/0265215 A1 | 12/2005 | Horie et al. |
| 2007/0133358 A1 | 6/2007 | Kubo et al. |
| 2010/0202187 A1 | 8/2010 | Kubo et al. |
| 2011/0170333 A1 | 7/2011 | Kubo et al. |

FOREIGN PATENT DOCUMENTS

JP      2007-250876 A      9/2007

*Primary Examiner* — Marvin Payen
(74) *Attorney, Agent, or Firm* — Holtz Holtz Goodman & Chick PC

(57) ABSTRACT

A nonvolatile memory device includes a first and second conductive unit and a memory layer. The memory layer is provided between the first conductive unit and the second conductive unit. The memory layer includes a material expressed by (M11−uM2u)xX+yα+zβ (M1 and M2 include at least one selected from the group consisting of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln (a lanthanoid element), X includes at least one of O and N, α includes at least one of Li, Na, K, Rb, Cs, and Fr, β includes at least one of F, Cl, Br, and I, $0.1 \leq x \leq 1.1$, $0.0001 \leq y \leq 0.2$, $0.9 \leq y/z \leq 1.1$).

20 Claims, 14 Drawing Sheets

| x | y | y/z | Ev | | x | y | y/z | Ev |
|---|---|---|---|---|---|---|---|---|
| 0.09 | 0.00009 | 0.89 | NG | | 1.10 | 0.00009 | 0.89 | NG |
| 0.09 | 0.00009 | 0.90 | NG | | 1.10 | 0.00009 | 0.90 | NG |
| 0.09 | 0.00009 | 1.10 | NG | | 1.10 | 0.00009 | 1.10 | NG |
| 0.09 | 0.00009 | 1.11 | NG | | 1.10 | 0.00009 | 1.11 | NG |
| 0.09 | 0.00010 | 0.89 | NG | | 1.10 | 0.00010 | 0.89 | NG |
| 0.09 | 0.00010 | 0.90 | NG | | 1.10 | 0.00010 | 0.90 | OK |
| 0.09 | 0.00010 | 1.10 | NG | | 1.10 | 0.00010 | 1.10 | OK |
| 0.09 | 0.00010 | 1.11 | NG | | 1.10 | 0.00010 | 1.11 | NG |
| 0.09 | 0.20000 | 0.89 | NG | | 1.10 | 0.20000 | 0.89 | NG |
| 0.09 | 0.20000 | 0.90 | NG | | 1.10 | 0.20000 | 0.90 | OK |
| 0.09 | 0.20000 | 1.10 | NG | | 1.10 | 0.20000 | 1.10 | OK |
| 0.09 | 0.20000 | 1.11 | NG | | 1.10 | 0.20000 | 1.11 | NG |
| 0.09 | 0.21000 | 0.89 | NG | | 1.10 | 0.21000 | 0.89 | NG |
| 0.09 | 0.21000 | 0.90 | NG | | 1.10 | 0.21000 | 0.90 | NG |
| 0.09 | 0.21000 | 1.10 | NG | | 1.10 | 0.21000 | 1.10 | NG |
| 0.09 | 0.21000 | 1.11 | NG | | 1.10 | 0.21000 | 1.11 | NG |
| 0.10 | 0.00009 | 0.89 | NG | | 1.11 | 0.00009 | 0.89 | NG |
| 0.10 | 0.00009 | 0.90 | NG | | 1.11 | 0.00009 | 0.90 | NG |
| 0.10 | 0.00009 | 1.10 | NG | | 1.11 | 0.00009 | 1.10 | NG |
| 0.10 | 0.00009 | 1.11 | NG | | 1.11 | 0.00009 | 1.11 | NG |
| 0.10 | 0.00010 | 0.89 | NG | | 1.11 | 0.00010 | 0.89 | NG |
| 0.10 | 0.00010 | 0.90 | OK | | 1.11 | 0.00010 | 0.90 | NG |
| 0.10 | 0.00010 | 1.10 | OK | | 1.11 | 0.00010 | 1.10 | NG |
| 0.10 | 0.00010 | 1.11 | NG | | 1.11 | 0.00010 | 1.11 | NG |
| 0.10 | 0.20000 | 0.89 | NG | | 1.11 | 0.20000 | 0.89 | NG |
| 0.10 | 0.20000 | 0.90 | OK | | 1.11 | 0.20000 | 0.90 | NG |
| 0.10 | 0.20000 | 1.10 | OK | | 1.11 | 0.20000 | 1.10 | NG |
| 0.10 | 0.20000 | 1.11 | NG | | 1.11 | 0.20000 | 1.11 | NG |
| 0.10 | 0.21000 | 0.89 | NG | | 1.11 | 0.21000 | 0.89 | NG |
| 0.10 | 0.21000 | 0.90 | NG | | 1.11 | 0.21000 | 0.90 | NG |
| 0.10 | 0.21000 | 1.10 | NG | | 1.11 | 0.21000 | 1.10 | NG |
| 0.10 | 0.21000 | 1.11 | NG | | 1.11 | 0.21000 | 1.11 | NG |

FIG. 5

NONVOLATILE MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2012-068498, filed on Mar. 24, 2012; the entire contents of which are incorporated herein by reference.

FIELD

Embodiments described herein relate generally to a nonvolatile memory device and a method for manufacturing same.

BACKGROUND

These days, small-sized mobile devices are widely used all over the world, and at the same time demand for small-sized large capacity nonvolatile memory devices is rapidly expanding with the significant development of high-speed information transmission networks. Some new memories aimed at greatly exceeding the limit of the memory density are proposed. For example, a memory using a resistance change material having a low resistance state and a high resistance state is proposed.

BRIEF DESCRIPTION OF THE DRAWINGS

FIG. 5 is a table illustrating characteristics of the nonvolatile memory device;

DETAILED DESCRIPTION

Figure 1:
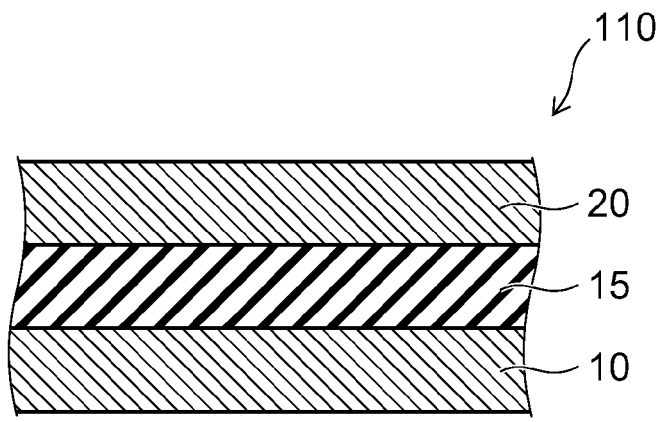
FIG. 1 is a schematic cross-sectional view illustrating the configuration of a nonvolatile memory device according to a first embodiment.

According to one embodiment, a nonvolatile memory device includes a first conductive unit, a second conductive unit, and a memory layer. The memory layer is provided between the first conductive unit and the second conductive unit. The memory layer is capable of reversibly transitioning between a first state and a second state due to a current supplied via the first conductive unit and the second conductive unit. A resistance of the second state is higher than a resistance of the first state. The memory layer includes a material expressed by $(M1_{1-u}M2_u)_xX+y\alpha+z\beta$ (M1 and M2 include at least one selected from the group consisting of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln (a lanthanoid element), X includes at least one of O and N, $\alpha$ includes at least one of Li, Na, K, Rb, Cs, and Fr, $\beta$ includes at least one of F, Cl, Br, and I, $0.1 \leq x \leq 1.1$, $0.0001 \leq y \leq 0.2$, $0.9 \leq y/z \leq 1.1$).

According to another embodiment, a method is disclosed for manufacturing a nonvolatile memory device. The method can include forming a first conductive unit. The method can include forming a memory layer on the first conductive unit using a material expressed by $(M1_{1-u}M2_u)_xX+y\alpha+z\beta$ (M1 and M2 include at least one selected from the group consisting of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln (a lanthanoid element), X includes at least one of O and N, $\alpha$ includes at least one of Li, Na, K, Rb, Cs, and Fr, $\beta$ includes at least one of F, Cl, Br, and I, $0.1 \leq x \leq 1.1$, $0.0001 \leq y \leq 0.2$, $0.9 \leq y/z \leq 1.1$), the memory layer being capable of reversibly transitioning between a first state and a second state, a resistance of the second state being higher than a resistance of the first state. The method can include forming a second conductive unit on the memory layer.

Various embodiments will be described hereinafter with reference to the accompanying drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a schematic cross-sectional view illustrating the configuration of a nonvolatile memory device according to a first embodiment.

As shown in FIG. 1, a nonvolatile memory device 110 according to the embodiment includes a first conductive unit 10, a second conductive unit 20, and a memory layer 15. The memory layer 15 is provided between the first conductive unit 10 and the second conductive unit 20.

A current is supplied to the memory layer 15 via the first conductive unit 10 and the second conductive unit 20. The memory layer 15 can reversibly transition between a first state with a low resistance (a low resistance state) and a second state with a higher resistance than the first state (a high resistance state) due to the current.

The nonvolatile memory device 110 performs the storage of information by utilizing the transition of the state of the memory layer 15. For example, the high resistance state is taken as a digital signal of "0", and the low resistance state is taken as a digital signal of "1". Thereby, information of one-bit digital signals can be stored.

For the memory layer 15, for example, a material expressed by $(M1_{1-u}M2_u)_xX+y\alpha+z\beta$ is used.

Here, "M1" and "M2" include, for example, at least one selected from the group consisting of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln (a lanthanoid element).

The lanthanoid element Ln includes at least one of La, Ce, Pr, Nd, Pm, Sm, Eu, Gd, Tb, Dy, Ho, Er, Tm, Yb, and Lu.

"M1" and "M2" are preferably at least one selected from the group consisting of V, Cr, Mn, Fe, Co, and Ni. Thereby, it becomes easy to control the electronic state in the crystal.

"X" includes, for example, at least one of O and N.

"α" includes, for example, at least one of Li, Na, K, Rb, Cs, and Fr.

"β" includes, for example, at least one of F, Cl, Br, and I.

The composition ratio "x" satisfies $0.1 \leq x \leq 1.1$.

The composition ratio "y" satisfies $0.0001 \leq y \leq 0.2$

The composition ratio "z" satisfies $0.9 \leq y/z \leq 1.1$.

That is, "X" includes O or N as a main component, and includes an alkali metal element and a halogen element in an amount of not less than 0.01% and not more than 20% of the number of anions.

The composition ratio "u" is an arbitrary value of not less than 0 and not more than 1. That is, for "M1" and "M2", only one of them being present is possible. In other words, the memory layer 15 may be a ternary compound including M1, M2, and X, or may be a binary compound including M1 and X.

The material and composition ratios of the memory layer 15 can be analyzed by, for example, secondary ion mass spectrometry (SIMS).

As the material used for the memory layer 15, a composite compound including at least one kind of cation element is used. A transition element having a d orbital partially filled with an electron(s) is used as the at least one kind of cation element. The average shortest distance between adjacent cations is set to 0.32 nm. Thereby, the electron conductivity of the memory layer 15 is improved.

For example, in the case where two kinds of cation elements are used, one is M1 and the other is M2. In the case where three or more kinds of cation elements are used, one of the cation elements is M1 and the other cation elements are included in M2. Alternatively, one of the cation elements is M2, and the other cation elements are included in M1.

The material used for the memory layer 15 has, for example, a crystal structure of one of the spinel structure,
the ilmenite structure,
the hollandite structure,
the wolframite structure,
the ramsdellite structure,
the delafossite structure,
the $\alpha$-NaFeO$_2$ structure,
the LiMoN$_2$ structure,
the fluorite structure,
the rock salt structure,
the rutile structure, and
the anatase structure.

The crystal structure of the memory layer 15 can be analyzed by, for example, the X-ray diffraction (XRD) method.

Figure 2:
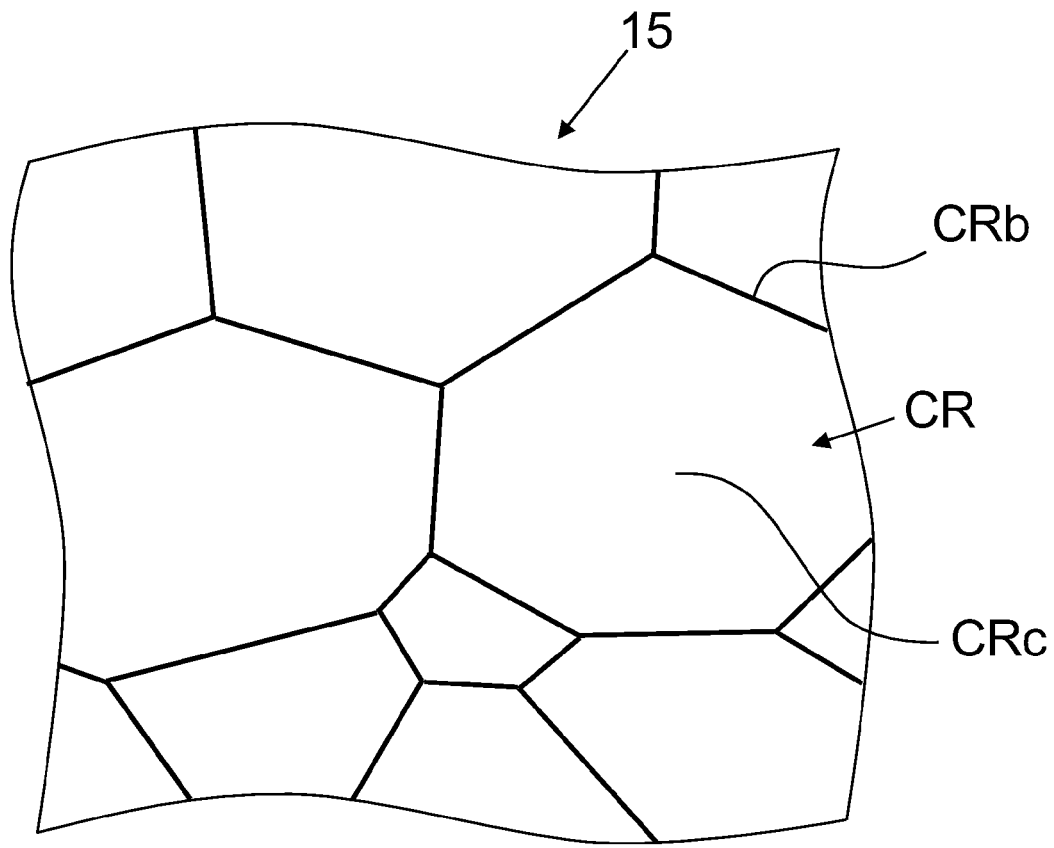
FIG. 2 is a schematic view illustrating the configuration of a portion of the nonvolatile memory device according to the first embodiment.

FIG. 2 is a schematic view illustrating the configuration of a portion of the nonvolatile memory device according to the first embodiment.

FIG. 2 illustrates the crystal CR of the memory layer 15.

The memory layer 15 is formed by, for example, sputtering. In the sputtering, a material including M1, M2, X, $\alpha$, and $\beta$ mentioned above is used as a target.

Of M1, M2, X, $\alpha$, and $\beta$, $\alpha$ and $\beta$ gather in and around the grain boundary portion CRb of the crystal CR when crystallized in one of the crystal structures mentioned above. Therefore, the concentration of $\alpha$ in the grain boundary portion CRb of the crystal CR is higher than the concentration of $\alpha$ in the central portion CRc of the crystal CR. The concentration of $\beta$ in the grain boundary portion CRb of the crystal CR is higher than the concentration of $\beta$ in the central portion CRc of the crystal CR.

By using such a material for the memory layer 15, the number of times at which transition can be made between the low resistance state and the high resistance state is increased while a high recording density is achieved. For example, the switching probability is improved. The switching probability is the proportion of the number of times at which the memory layer 15 transitions normally in response to the processing of transitioning the memory layer 15 between the low resistance state and the high resistance state to the number of times of the processing performed. The transition between the low resistance state and the high resistance state corresponds to the writing and erasing of information. Therefore, when the switching probability is improved, the cycle life in which the writing and erasing of information can be normally performed is improved. By the embodiment, a nonvolatile memory device with high operational stability is obtained. For example, in the embodiment, a memory density of Pbpsi (petabit per square inch) or more can be achieved.

Examples of the operation in the nonvolatile memory device 110 according to the embodiment will now be described in a model way.

Figure 3:
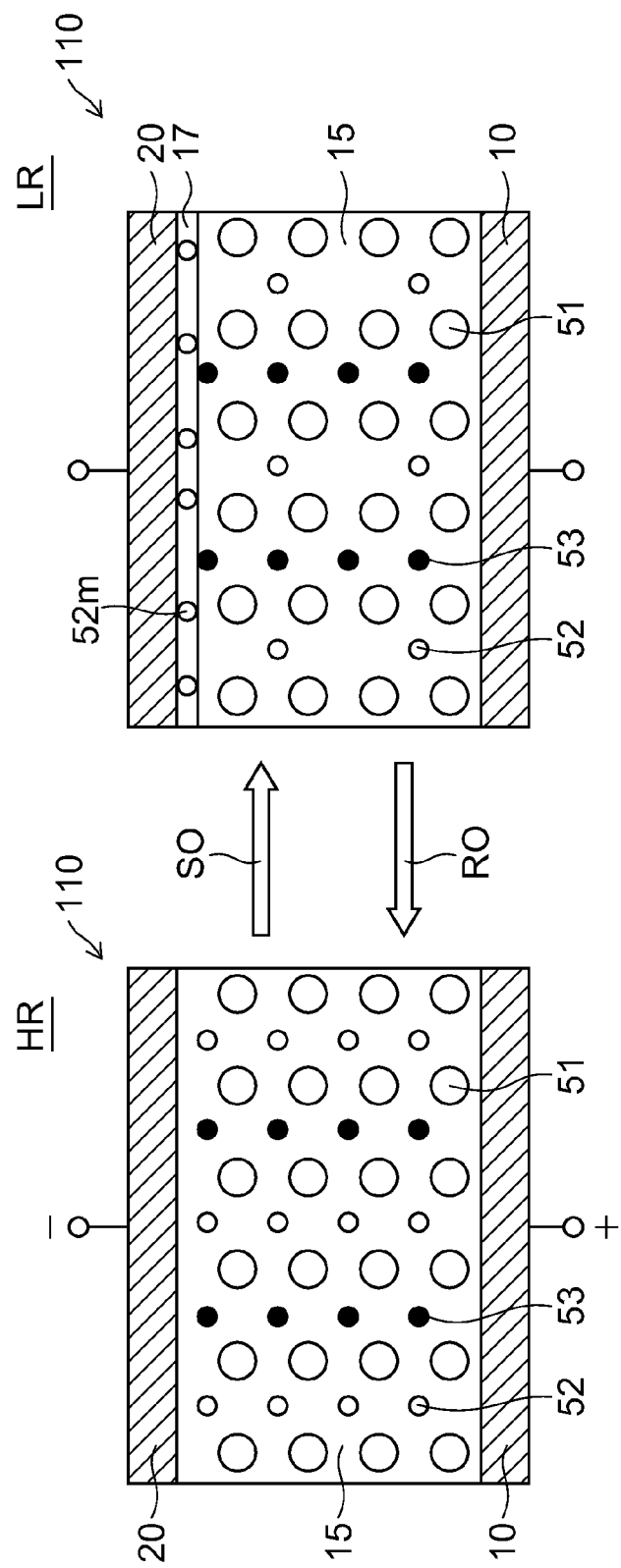
FIG. 3 is a schematic view illustrating operations of the nonvolatile memory device according to the first embodiment.

FIG. 3 is a schematic view illustrating operations of the nonvolatile memory device according to the first embodiment.

As shown in FIG. 3, the memory layer 15 has a low resistance state (a low resistance state LR) with a low resistance (resistivity) and a high resistance state (a high resistance state HR) with a higher resistance (resistivity) than the low resistance state. The memory layer 15 can reversibly transition between the low resistance state LR and the high resistance state HR.

In the following, a description is given on the assumption that the initial state of the memory layer 15 is the high resistance state HR.

The memory layer 15 is changed to the low resistance state LR by a potential gradient provided to the memory layer 15; thereby, the writing of information is performed.

The memory layer 15 includes cations of which the positions are fixed (first cations 51), cations that can move (second cations 52), and anions 53. For example, the element of "M1" mentioned above is used as the first cation 51, the element of "M2" mentioned above is used as the second cation 52, and the element of "X" mentioned above is used as the anion 53. At least part of the first cations 51 are, for example, a transition element. That is, the valence of the first cation 51 can change.

First, for example, a state is created in which the electric potential of the second conductive unit 20 is lower than the electric potential of the first conductive unit 10. For example, the first conductive unit 10 is set at a fixed potential (e.g. the ground potential) and a negative potential is applied to the second conductive unit 20. Thereby, part of the second cations 52 move toward the second conductive unit 20 (cathode) in the crystal (in the memory layer 15). In the memory layer 15 that is a crystal, the number of second cations 52 becomes smaller than the number of anions 53.

The second cations 52 that have moved to the side of the second conductive unit 20 receive electrons from the second conductive unit 20, and deposit as metal atoms 52m to form a metal layer 17, for example. That is, in a region near the second conductive unit 20 of the memory layer 15, the second cation 52 is reduced and behaves like a metal. Thereby, the electric resistance decreases.

On the other hand, in the memory layer 15, since the amount of anions 53 becomes excessive, the valence of the first cation 51 that is left in the memory layer 15 increases. Thereby, electrical conductivity occurs in the memory layer 15. Consequently, the condition changes into the low resistance state LR as the whole memory layer 15. The operation is referred to as a set operation SO. The set operation SO is, for example, the write operation.

The reading of written information is performed by, for example, applying a voltage pulse to the memory layer 15 and detecting the resistance value of the memory layer 15. At this time, the magnitude of the voltage pulse is set to such a small value that the resistance of the memory layer 15 does not change.

The process described above is a kind of electrolysis. For example, an oxidizing agent is produced on the side of the first conductive unit 10 (anode) due to electrochemical oxidation, and a reducing agent is produced on the side of the second conductive unit 20 (cathode) due to electrochemical reduction.

On the other hand, in an operation that returns the low resistance state LR to the high resistance state HR (a reset operation RO), for example, a large current pulse is applied to the memory layer 15, and the resulting Joule heat is used to heat the memory layer 15 to promote the redox reaction of the memory layer 15. Due to the Joule heat, the second cations 52 return into the thermally more stable crystal structure (into the memory layer 15), and the initial high resistance state HR appears. The reset operation RO is, for example, the erase operation.

The reset operation RO can be performed also by applying a voltage pulse with a polarity opposite to that of the set operation SO. For example, the first conductive unit 10 is set at a fixed potential, and a positive potential is applied to the second conductive unit 20. Thereby, the metal atoms 52m near the second conductive unit 20 give electrons to the second conductive unit 20 to become the second cations 52. The second cations 52 return into the memory layer 15 due to the potential gradient in the memory layer 15. Thereby, the condition changes into the initial high resistance state HR.

Thus, the write operation and the erase operation, that is, the set operation SO and the reset operation RO of the nonvolatile memory device 110 according to the embodiment are performed.

In order to put to practical use such a nonvolatile memory device in which the set operation SO and the reset operation RO are performed, the following two conditions are preferably satisfied. One is that the reset operation RO at room temperature be sufficiently suppressed. In other words, it is that a sufficiently long retention time be ensured. The other is that the power consumption of the reset operation RO be sufficiently small.

The reset operation RO at room temperature can be suppressed by, for example, making the first cation 51 and the second cation 52 have a valence of 2 or more. The power consumption of the reset operation RO can be reduced by, for example, introducing such an ion radius and a movement path of the second cation 52 that the second cation 52 can move in the memory layer 15 (in the crystal CR) without causing crystal fracture. These conditions can be fulfilled by using the memory layer 15 having the element and the crystal structure described above.

An oxidizing agent is produced on the first conductive unit 10 (anode) side after the set operation SO. In view of this, a hardly oxidizable material is used for the first conductive unit 10. Thereby, the deterioration of the nonvolatile memory device 110 due to the oxidation of the first conductive unit 10 can be prevented. As the hardly oxidizable material, for example, an electrically conductive nitride, an electrically conductive oxide, and the like are given.

The material of the first conductive unit 10 is preferably one having no ionic conductivity.

As the material that is hardly oxidizable and has no ionic conductivity, for example, $D1N$, $D2O_t$, $D3D4O_3$, $D5_2D6O_4$, and the like are given.

Here, "D1" includes at least one selected from the group consisting of Ti, Zr, Hf, V, Nb, and Ta.

"N" is nitrogen.

"D2" includes at least one selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

The composition ratio t satisfies $1 \leq t \leq 4$.

"O" is oxygen.

"D3" includes at least one selected from the group consisting of La, K, Ca, Sr, Ba, and Ln (a lanthanoid element).

"D4" includes at least one selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

"D5" includes at least one selected from the group consisting of K, Ca, Sr, Ba, and Ln (a lanthanoid element).

"D6" includes at least one selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

Of the above, the most preferable material is $LaNiO_3$ from the viewpoint of overall performance taking into account good electrical conductivity etc.

Figure 4:
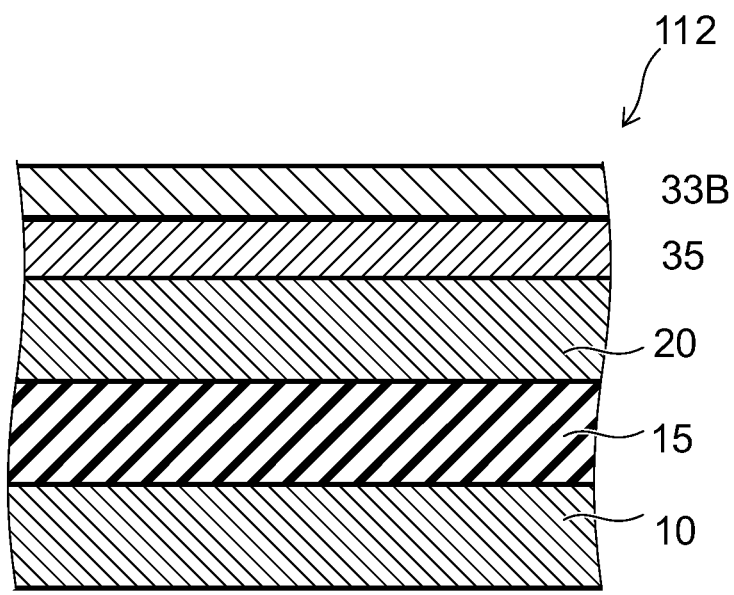
FIG. 4 is a schematic view illustrating the configuration of another nonvolatile memory device according to the first embodiment.

FIG. 4 is a schematic view illustrating the configuration of another nonvolatile memory device according to the first embodiment.

As shown in FIG. 4, a nonvolatile memory device 112 further includes a heater layer 35 and a protection layer 33B. The protection layer 33B is provided on the second conductive unit 20. That is, the second conductive unit 20 is disposed between the memory layer 15 and the protection layer 33B. The protection layer 33B protects the second conductive unit 20. The heater layer 35 is provided between the second conductive unit 20 and the protection layer 33B. The heater layer 35 is used for the heating of the memory layer 15 in the reset operation RO. Thereby, the redox reaction of the memory layer 15 in the reset operation RO can be further promoted. The protection layer 33B may be provided under the first conductive unit 10. The heater layer 35 and the protection layer 33B are provided as necessary and may be omitted.

After the set operation SO, a reducing agent is produced in a portion on the second conductive unit 20 side of the memory layer 15. In view of this, for the protection layer 33B, for example, a semiconductor such as $SnO_2$, amorphous carbon, diamond-like carbon, and the like are used. Thereby, the reducing agent produced in the memory layer 15 after the set operation SO can be prevented from reacting with the air. For the heater layer 35, for example, a material having a resistivity of approximately $10^{-5}$ Ωcm or more is used.

A Peltier element film may be provided between the first conductive unit 10 and the memory layer 15 or between the second conductive unit 20 and the memory layer 15. Thereby, only the memory layer 15 can be effectively heated while the first conductive unit 10 and the second conductive unit 20 are protected. For example, a p-type Peltier element film is provided between the first conductive unit 10 that is an anode and the memory layer 15. The p-type Peltier element film transfers heat from the first conductive unit 10 toward the memory layer 15. Thereby, the memory layer 15 can be efficiently heated while the deterioration of the first conductive unit 10 is suppressed. Thus, all of the characteristics of the cycle life, the reset probability, and the power consumption in the reset operation RO are improved.

For the p-type Peltier element film, for example, a material with a large Peltier coefficient is used. The Peltier coefficient is expressed by the product of the Seebeck coefficient and temperature. Therefore, a material with a large Seebeck coefficient is used for the p-type Peltier element film. In a material with a large Seebeck coefficient, for example, the state density at the Fermi surface is steep. For the p-type Peltier element film, for example, a material is used that has a large Seebeck coefficient, is a strongly correlated electron system, and has a crystal structure of a low-dimensional structure. Thereby, the characteristics of the nonvolatile memory device 112 are further improved. Examples of the material satisfying these conditions include, for example, $Ca_3Co_4O_9$, $LaCaCoO_4$, $La_2CuO_4$, $CuAlO_2$, and the like. The resistance value of the p-type Peltier element film is set lower than the resistance value of the memory layer 15. In view of this, any of the materials mentioned above doped with a small amount of p-type carriers to reduce the resistance is used for the p-type Peltier element film. Thereby, all these materials have a Seebeck coefficient of 100 μV/K or more. When the materials mentioned above are used, an effect of cooling the first conductive unit 10 by 30% to 100% with respect to the total heat generation amount of the memory layer 15 in the reset operation RO is expected in terms of calculation.

Examples of the characteristics of the material in regard to the memory layer 15 will now be described.

In the samples, a disc made of a glass substrate with a diameter of approximately 60 mm and a thickness of approximately 1 mm is used. A lower electrode layer is provided on the disc, a sample layer that forms the memory layer 15 is provided on the lower electrode layer, and an upper electrode layer and a protection layer are provided on the sample layer. A Pt film with a thickness of 500 nm is used as the lower electrode layer and the upper electrode layer. Diamond-like carbon (DLC) is used for the protection layer.

The memory layer 15 can be formed by RF magnetron sputtering in a prescribed atmosphere using a prescribed target including a material that forms the memory layer 15. The temperature of the disc in the formation of the memory layer 15 is kept at a value in the range from 300° C. to 600° C. The thickness of the memory layer 15 is approximately 10 nm.

A probe of tungsten (W) is brought into contact with the upper electrode layer to pass a current through the memory layer 15. The diameter of the tip of the probe is approximately 10 nm. In the write operation, a voltage pulse of 10 nanoseconds (ns) and 1 volt (V) is applied between the lower electrode layer and the probe. In the erase operation, a voltage pulse of 100 ns and 0.2 V is applied between the lower electrode layer and the probe. The switching probability when the ratio of the resistance value of the high resistance stare HR to the resistance value of the low resistance state LR in the memory layer 15 (ON/OFF ratio) is not less than 1,000 when the write operation and the erase operation are repeatedly performed is used as the evaluation value.

In a first sample, $ZnV_2O_4+0.1Li+0.1F$ is used as the memory layer 15. The memory layer 15 in the first sample is formed by using an alloy target of $ZnV_2O_4+0.1Li+0.1F$ and performing RF magnetron sputtering in an atmosphere including 95% Ar and 5% $O_2$. Diamond-like carbon is formed with a thickness of approximately 3 nm on the memory layer 15 by the CVD (chemical vapor deposition) method, for example.

The probe is brought into contact with 10,000 points of the first sample to apply a voltage pulse to the sample. In the first sample, writing and erasing are repeated at an ON/OFF ratio of 1,000 or more at all the points. That is, the switching probability of the first sample is 100%. The number of switching times SWN of the first sample is 10,000 cycles or more.

In the following samples, the matters not described are similar to those of the first sample mentioned above.

In a second sample, $ZnCr_2O_4+0.1Li+0.1F$ is used as the memory layer 15.

In a third sample, $ZnMn_2O_4+0.1Li+0.1F$ is used as the memory layer 15.

In a fourth sample, $ZnCo_2O_4+0.1Li+0.1F$ is used as the memory layer 15.

In a fifth sample, $MgCr_2O_4+0.1Li+0.1F$ is used as the memory layer 15.

In a sixth sample, $MgMn_2O_4+0.1Li+0.1F$ is used as the memory layer 15.

In a seventh sample, $MgCo_2O_4+0.1Li+0.1F$ is used as the memory layer 15.

In an eighth sample, $CoMn_2O_4+0.1Li+0.1F$ is used as the memory layer 15.

In a ninth sample, $CaCr_2O_4+0.1Li+0.1F$ is used as the memory layer 15.

In a tenth sample, $CaMn_2O_4+0.1Li+0.1F$ is used as the memory layer 15.

In an eleventh sample, $SrMn_2O_4+0.1Li+0.1F$ is used as the memory layer 15.

In a twelfth sample, $Ba_{0.25}Mn_2O_4+0.1Li+0.1F$ is used as the memory layer 15. For the manufacturing method, $Ba_{0.25}Mn_2O_4+0.1Li+0.1F$ is formed by the sputtering method, and Ba is formed with a thickness of approximately 10 nm.

In a thirteenth sample, $Zn_{0.25}Mn_2O_4+0.1Li+0.1F$ is used as the memory layer 15. For the manufacturing method, $Zn_{0.25}Mn_2O_4+0.1Li+0.1F$ is formed by the sputtering method, and Zn is formed with a thickness of approximately 10 nm.

In a fourteenth sample, $CuAlO_2+0.1Li+0.1F$ is used as the memory layer 15.

In a fifteenth sample, $MgCrO_3+0.1Li+0.1F$ is used as the memory layer 15.

In a sixteenth sample, $NiWN_2+0.1Li+0.1F$ is used as the memory layer 15. $SnO_2$ is used as the protection layer. For the manufacturing method, $NiWN_2+0.1Li+0.1F$ is formed by the sputtering method in an atmosphere of 95% Ar and 35% NH.

In a seventeenth sample, $Zn_{1.2}V_{1.8}O_4+0.1Li+0.1F$ is used as the memory layer 15. $SnO_2$ is used as the protection layer.

In an eighteenth sample, $Zn_{1.2}Cr_{1.8}O_4+0.1Li+0.1F$ is used as the memory layer 15. $SnO_2$ is used as the protection layer.

In a nineteenth sample, $ZnAl_{1.8}Cr_{0.2}O_4+0.1Li+0.1F$ is used as the memory layer 15. $SnO_2$ is used as the protection layer.

In a twentieth sample, $ZnAl_{1.8}Mn_{0.2}O_4+0.1Li+0.1F$ is used as the memory layer 15. $SnO_2$ is used as the protection layer.

In a twenty-first sample, $ZnSc_{1.8}Mn_{0.2}O_4+0.1Li+0.1F$ is used as the memory layer 15. $SnO_2$ is used as the protection layer.

In a twenty-second sample, $ZnY_{1.8}Mn_{0.2}O_4+0.1Li+0.1F$ is used as the memory layer 15. $SnO_2$ is used as the protection layer.

In a twenty-third sample, $ZnLn_{1.8}Mn_{0.2}O_4+0.1Li+0.1F$ is used as the memory layer 15. $SnO_2$ is used as the protection layer.

In a twenty-fourth sample, $ZnGa_{1.8}Mn_{0.2}O_4+0.1Li+0.1F$ is used as the memory layer 15. $SnO_2$ is used as the protection layer.

In a twenty-fifth sample, $ZnAl_{1.8}Ti_{0.2}O_4+0.1Li+0.1F$ is used as the memory layer 15. $SnO_2$ is used as the protection layer.

In a twenty-sixth sample, $ZnAl_{1.8}Zr_{0.2}O_4+0.1Li+0.1F$ is used as the memory layer 15. $SnO_2$ is used as the protection layer.

In a twenty-seventh sample, $ZnAl_{1.8}Hf_{0.2}O_4+0.1Li+0.1F$ is used as the memory layer 15. $SnO_2$ is used as the protection layer.

In a twenty-eighth sample, $ZnAl_{1.8}Si_{0.2}O_4+0.1Li+0.1F$ is used as the memory layer 15. $SnO_2$ is used as the protection layer.

In a twenty-ninth sample, $ZnAl_{1.8}Ge_{0.2}O_4+0.1Li+0.1F$ is used as the memory layer 15. $SnO_2$ is used as the protection layer.

In a thirtieth sample, $ZnAl_{1.8}Sn_{0.2}O_4+0.1Li+0.1F$ is used as the memory layer 15. $SnO_2$ is used as the protection layer.

In a thirty-first sample, $ZnFe_{1.8}Mn_{0.2}O_4+0.1Li+0.1F$ is used as the memory layer 15. $SnO_2$ is used as the protection layer.

In a thirty-second sample, $ZnAl_{1.8}Nb_{0.2}O_4+0.1Li+0.1F$ is used as the memory layer 15. $SnO_2$ is used as the protection layer.

In a thirty-third sample, $ZnAl_{1.8}Ta_{0.2}O_4+0.1Li+0.1F$ is used as the memory layer 15. $SnO_2$ is used as the protection layer.

In a thirty-fourth sample, $ZnAl_{1.8}Mo_{0.2}O_4+0.1Li+0.1F$ is used as the memory layer 15. $SnO_2$ is used as the protection layer.

In a thirty-fifth sample, $ZnAl_{1.8}Ru_{0.2}O_4+0.1Li+0.1F$ is used as the memory layer 15. $SnO_2$ is used as the protection layer.

In a thirty-sixth sample, $ZnAl_{1.8}Rh_{0.2}O_4+0.1Li+0.1F$ is used as the memory layer 15. $SnO_2$ is used as the protection layer.

In the second to thirty-sixth samples above, the probe is brought into contact with 10,000 points of the samples to apply a voltage pulse, and writing and erasing are repeated at an ON/OFF ratio of 1,000 or more at all the points. That is, the switching probability of the second to thirty-sixth samples is 100%. The number of switching times SWN of the second to thirty-sixth samples is 10,000 cycles or more.

In a thirty-seventh sample, $ZnV_2O_4$ is used as the memory layer 15.

In the thirty-seventh sample, the probe is brought into contact with 10,000 points of the sample to apply a voltage pulse. In the thirty-seventh sample, it is only at 7562 points out of the 10,000 points that writing and erasing are repeated at an ON/OFF ratio of 1,000 or more. That is, the switching probability of the thirty-seventh sample is 75.62%.

In a thirty-eighth sample, $ZnCr_2O_4$ is used as the memory layer 15.

In the thirty-eighth sample, the probe is brought into contact with 10,000 points of the sample to apply a voltage pulse. In the thirty-eighth sample, it is only at 8541 points out of the 10,000 points that writing and erasing are repeated at an ON/OFF ratio of 1,000 or more. That is, the switching probability of the thirty-eighth sample is 85.41%.

In a thirty-ninth sample, $ZnMn_2O_4$ is used as the memory layer 15.

In the thirty-ninth sample, the probe is brought into contact with 10,000 points of the sample to apply a voltage pulse. In the thirty-ninth sample, it is only at 9682 points out of the 10,000 points that writing and erasing are repeated at an ON/OFF ratio of 1,000 or more. That is, the switching probability of the thirty-ninth sample is 96.82%.

In a fortieth sample, $ZnCo_2O_4$ is used as the memory layer 15.

In the fortieth sample, the probe is brought into contact with 10,000 points of the sample to apply a voltage pulse. In the fortieth sample, it is only at 6534 points out of the 10,000 points that writing and erasing are repeated at an ON/OFF ratio of 1,000 or more. That is, the switching probability of the fortieth sample is 65.34%.

In a forty-first sample, $MgCr_2O_4$ is used as the memory layer 15.

In the forty-first sample, the probe is brought into contact with 10,000 points of the sample to apply a voltage pulse. In the forty-first sample, it is only at 3766 points out of the 10,000 points that writing and erasing are repeated at an ON/OFF ratio of 1,000 or more. That is, the switching probability of the forty-first sample is 37.66%.

In a forty-second sample, $MgMn_2O_4$ is used as the memory layer 15.

In the forty-second sample, the probe is brought into contact with 10,000 points of the sample to apply a voltage pulse. In the forty-second sample, it is only at 3587 points out of the 10,000 points that writing and erasing are repeated at an ON/OFF ratio of 1,000 or more. That is, the switching probability of the forty-second sample is 35.87%.

In the first to thirty-sixth samples, the memory layer 15 is a material expressed by $(M1_{1-u}M2_u)_xX+y\alpha+z\beta$. In the thirty-seventh to forty-second samples, the memory layer 15 is not a material expressed by $(M1_{1-u}M2_u)_xX+y\alpha+z\beta$. Thus, by using a material expressed by $(M1_{1-u}M2_u)_xX+y\alpha+z\beta$ for the memory layer 15, the number of times at which transition can be made between the low resistance state and the high resistance state is increased. That is, operational stability is improved.

In the embodiment, the composition ratio "x" of $(M1_{1-u}M2_u)_xX+y\alpha+z\beta$ included in the memory layer 15 satisfies $0.1 \leq x \leq 1.1$. The composition ratio "y" satisfies $0.0001 \leq y \leq 0.2$. The composition ratio "z" satisfies $0.9 \leq (y/z) \leq 1.1$.

Examples of the characteristics of the memory layer 15 when the composition ratio x, the composition ratio y, and the composition ratio z are changed will now be described.

FIG. 5 is a table illustrating characteristics of the nonvolatile memory device.

FIG. 5 shows the evaluation Ev of the switching probability when the composition ratio x, the composition ratio y, and the composition ratio z are changed in the material expressed by $(M1_{1-u}M2_u)_xX+y\alpha+z\beta$. Here, the case where the switching probability is 100% when the mutual transition (switching) between the low resistance state and the high resistance state is performed at 10,000 points of the memory layer 15 is a state where good characteristics are obtained. The case where the switching probability is less than 100% is a state where the characteristics are not good.

In FIG. 5, the state where good characteristics are obtained is expressed as "OK" for "the evaluation Ev". The state where the characteristics are not good is expressed as "NG" for "the evaluation Ev". FIG. 5 shows examples in which Zn is used as "M1", Mn is used as "M2", O (oxygen) is used as "X", Li is used as "α", and F is used as "β".

As can be seen from FIG. 5, when good characteristics are obtained (when the evaluation Ev is "OK"), the composition ratio x is not less than 0.1 and not more than 1.1. Good characteristics are not obtained (the evaluation Ev is "NG") when the composition ratio x is smaller than 0.1 or larger than 1.1. Even when the composition ratio x is not less than 0.1 and not more than 1.1, good characteristics are not obtained when the composition ratio y is smaller than 0.0001 or larger than 0.2. Furthermore, even when the composition ratio x is not less than 0.1 and not more than 1.1, good characteristics are not obtained when y/z, which is the ratio between the composition ratio y and the composition ratio z, is smaller than 0.9 or larger than 1.1.

FIG. 5 shows examples in which "M1" is Zn, "M2" is Mn, "X" is O (oxygen), "a" is Li, and "β" is F. Also the case where "M1" and "M2" are one of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln has a similar tendency. Also the case where "X" is O or N has a similar tendency. Also the case where "a" is one of Na, K, Rb, Cs, and Fr has a similar tendency. Also the case where "β" is one of Cl, Br, and I has a similar tendency.

Thus, in the memory layer 15, good characteristics are obtained when, in the material expressed by $(M1_{1-u}M2_u)_xX+y\alpha+z\beta$, the composition ratio "x" is not less than 0.1 and not more than 1.1, the composition ratio "y" is not less than 0.0001 and not more than 0.2, and the composition ratio "y/z" is not less than 0.9 and not more than 1.1.

Second Embodiment

A nonvolatile memory device according to the embodiment has a cross-point configuration.

Figure 6:
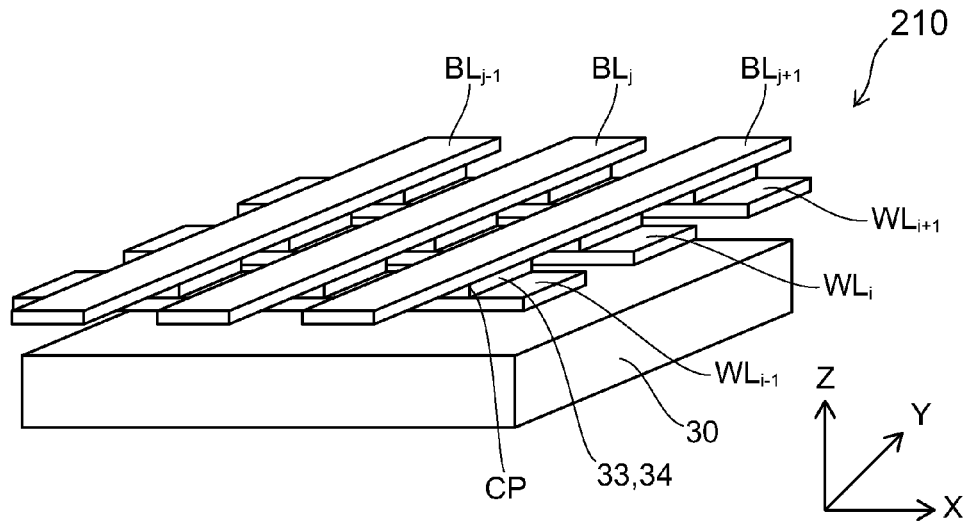
FIG. 6 is a schematic perspective view illustrating the configuration of a nonvolatile memory device according to a second embodiment.

FIG. 6 is a schematic perspective view illustrating the configuration of a nonvolatile memory device according to a second embodiment.

Figure 7:
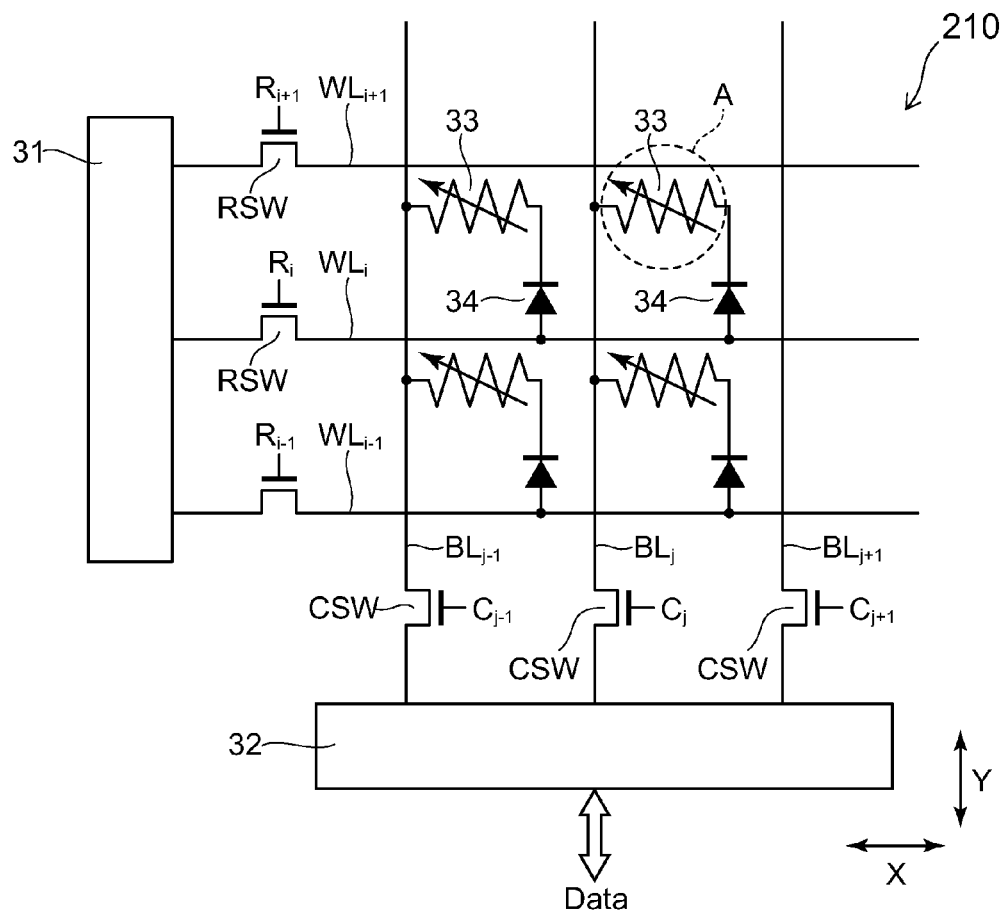
FIG. 7 is a schematic diagram illustrating the configuration of the nonvolatile memory device according to the second embodiment.

FIG. 7 is a schematic diagram illustrating the configuration of the nonvolatile memory device according to the second embodiment.

As shown in FIG. 6 and FIG. 7, a nonvolatile memory device 210 according to the embodiment includes a substrate 30. A plane parallel to the major surface of the substrate 30 is taken as the X-Y plane. One direction in the X-Y plane is taken as the X-axis direction. The direction perpendicular to the X-axis direction in the X-Y plane is taken as the Y-axis direction. The direction perpendicular to the X-axis direction and the Y-axis direction is taken as the Z-axis direction. The Z-axis direction is the stacking direction from the first conductive unit 10 toward the second conductive unit 20.

In the nonvolatile memory device 210, a plurality of first interconnections (word lines $WL_{i-1}$, $WL_i$, and $WL_{i+1}$) with band shapes extending in the X-axis direction (a first direction) are provided on the major surface of the substrate 30. The plurality of first interconnections are aligned in the Y-axis direction. Furthermore, a plurality of second interconnections (bit lines $BL_{j-1}$, $BL_j$, and $BL_{j+1}$) with band shapes extending in the Y-axis direction (a second direction) are provided. The plurality of second interconnections are aligned in the X-axis direction. The second interconnections (the bit lines $BL_{j-1}$, $BL_j$, and $BL_{j+1}$) are opposed to the first interconnections (the word lines $WL_{i-1}$, $WL_i$, and $WL_{i+1}$).

Although in the above the extending direction of the first interconnection is orthogonal to the extending direction of the second interconnection, it is sufficient that the extending direction of the first interconnection intersect with (be non-parallel to) the extending direction of the second interconnection.

In the above, the subscript i and the subscript j are arbitrary. That is, the number of first interconnections and the number of second interconnections are arbitrary.

In the specific example, the first interconnection forms the word line, and the second interconnection forms the bit line. However, the first interconnection may be the bit line, and the second interconnection may be the word line. In the following, a description is given on the assumption that the first interconnection is the word line and the second interconnection is the bit line.

As shown in FIG. 6 and FIG. 7, a memory cell 33 is provided between the first interconnection and the second interconnection.

As shown in FIG. 7, for example, one ends of the word lines $WL_{i-1}$, $WL_i$, and $WL_{i+1}$ are connected to a word line driver 31 having the decoder function via MOS transistors RSW that are select switches. One ends of the bit lines $BL_{j-1}$, $BL_j$, and $BL_{j+1}$ are connected to a bit line driver 32 having the decoder and read functions via MOS transistors CSW that are select switches.

Select signals $R_{i-1}$, $R_i$, and $R_{i+1}$ for selecting word lines (rows) are inputted to the gates of the MOS transistors RSW, and select signals $C_{i-1}$, $C_i$, and $C_{i+1}$ for selecting bit lines (columns) are inputted to the gates of the MOS transistors CSW.

The memory cell 33 is disposed in intersection portions CP where the word lines $WL_{i-1}$, $WL_i$, and $WL_{i+1}$ and the bit lines $BL_{j-1}$, $BL_j$, and $BL_{j+1}$ are opposed to each other. The nonvolatile memory device 210 includes a plurality of memory cells 33 arranged in the intersection portions CP of the word lines $WL_{i-1}$, $WL_i$, and $WL_{i+1}$ and the bit lines $BL_{j-1}$, $BL_j$, and $BL_{j+1}$. A rectifying element 34 for preventing a sneak current in writing/reading may be added to the memory cell 33.

Figure 8:
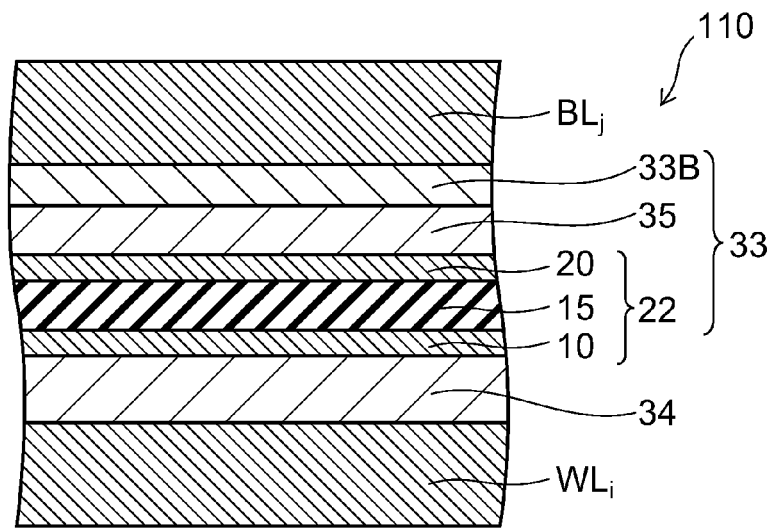
FIG. 8 is a schematic cross-sectional view illustrating the configuration of part of the nonvolatile memory device according to the second embodiment.

FIG. 8 is a schematic cross-sectional view illustrating the configuration of part of the nonvolatile memory device according to the second embodiment.

As shown in FIG. 8, the memory cell 33 and the rectifying element 34 are provided between the word line $WL_i$ and the bit line $BL_j$. In this example, the rectifying element 34 is provided between the first conductive unit 10 and the word line $WL_i$. The relationship of the vertical arrangement of the word line $WL_i$ and the bit line $BL_j$ is arbitrary. The order of the arrangement of the memory cell 33 and the rectifying element 34 between the word line $WL_i$ and the bit line $BL_j$ is arbitrary.

As shown in FIG. 8, the memory cell 33 includes a memory unit 22. The memory unit 22 includes the first conductive unit 10, the second conductive unit 20, and the memory layer 15 provided between the first conductive unit 10 and the second conductive unit 20. The first conductive unit 10 is disposed between the memory layer 15 and the word line $WL_i$. The word line $WL_i$ is electrically connected to the first conductive unit 10. The second conductive unit 20 is disposed between the memory layer 15 and the bit line $BL_j$. The bit line $BL_j$ is electrically connected to the second conductive unit 20. The configuration described in regard to the first embodiment can be used for the memory layer 15.

The memory cell 33 may further include the protection layer 33B. Although the protection layer 33B is provided on the bit line $BL_j$ side of the memory unit 22 in the specific example, the protection layer 33B may be provided on the word line $WL_i$ side of the memory unit 22, and may be provided between the rectifying element 34 and the word line $WL_i$. The memory cell 33 may further include the heater layer 35 provided between the memory unit 22 and the protection layer 33B. The heater layer 35 and the protection layer 33B are provided as necessary and may be omitted.

At least one of, for example, the word line $WL_i$, the rectifying element 34, the heater layer 35, the protection layer 33B, and the bit line $BL_j$ adjacent to the memory unit 22 may be used as at least one of the first conductive unit 10 and the second conductive unit 20.

Figure 9:
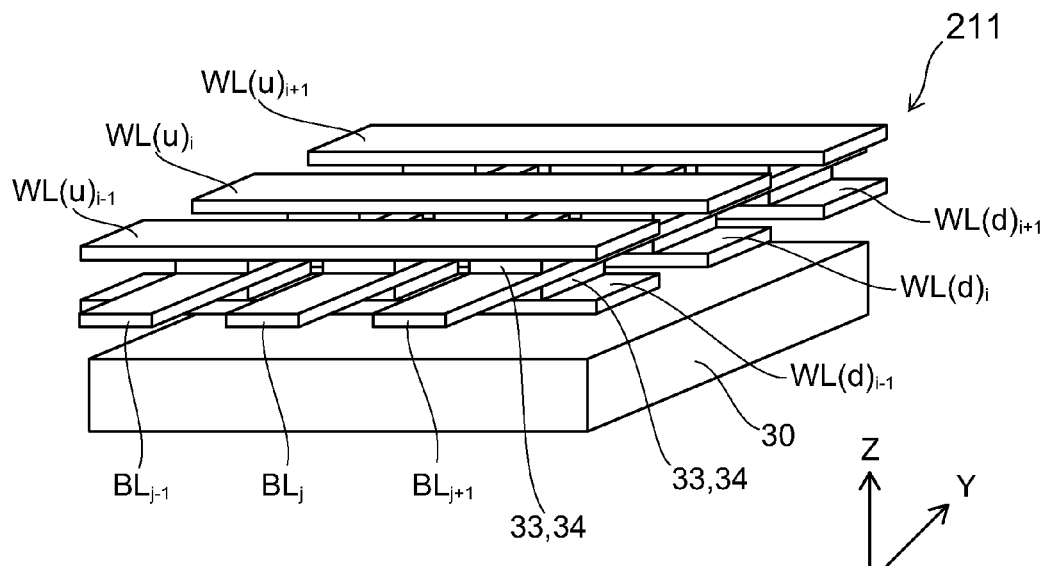
FIG. 9 is schematic perspective views illustrating the configurations of other nonvolatile memory devices according to the second embodiment.
Figure 10:
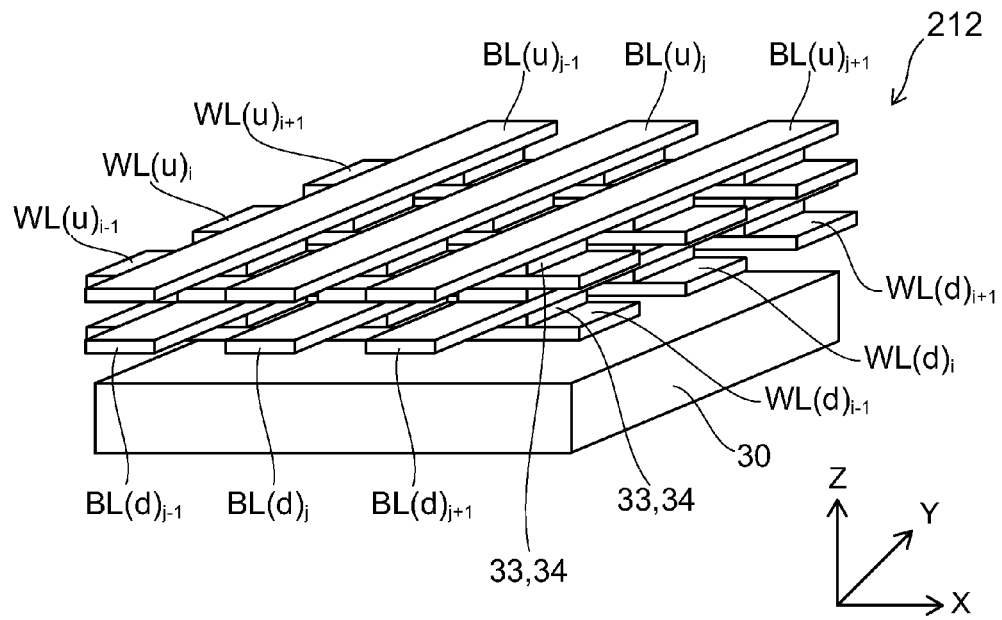
FIG. 10 is schematic perspective views illustrating the configurations of other nonvolatile memory devices according to the second embodiment.

FIG. 9 and FIG. 10 are schematic perspective views illustrating the configurations of other nonvolatile memory devices according to the second embodiment.

As shown in FIG. 9 and FIG. 10, in nonvolatile memory devices 211 and 212 according to the embodiment, a stacked structure body including the word line, the bit line, and the memory cell 33 provided therebetween is stacked in plural. Thereby, three-dimensionally structured nonvolatile memory devices are formed.

In the nonvolatile memory devices 210, 211, and 212 according to the embodiment, the word line driver 31 and the bit line driver 32 serving as a drive unit perform at least one of applying a voltage to the memory layer 15 and passing a current through the memory layer 15 via the word line $WL_i$ and the bit line $BL_j$. Thereby, a change is produced in the memory layer 15 to write information. For example, the drive unit applies a voltage to the memory layer 15 to produce a change in the memory layer 15 to write information. Furthermore, written information can be read out. Furthermore, erasing can be performed.

Also the nonvolatile memory devices 210, 211, and 212 according to the embodiment can provide a nonvolatile memory device with high operational stability.

Third Embodiment

A nonvolatile memory device according to the embodiment has a probe memory configuration.

Figure 11:
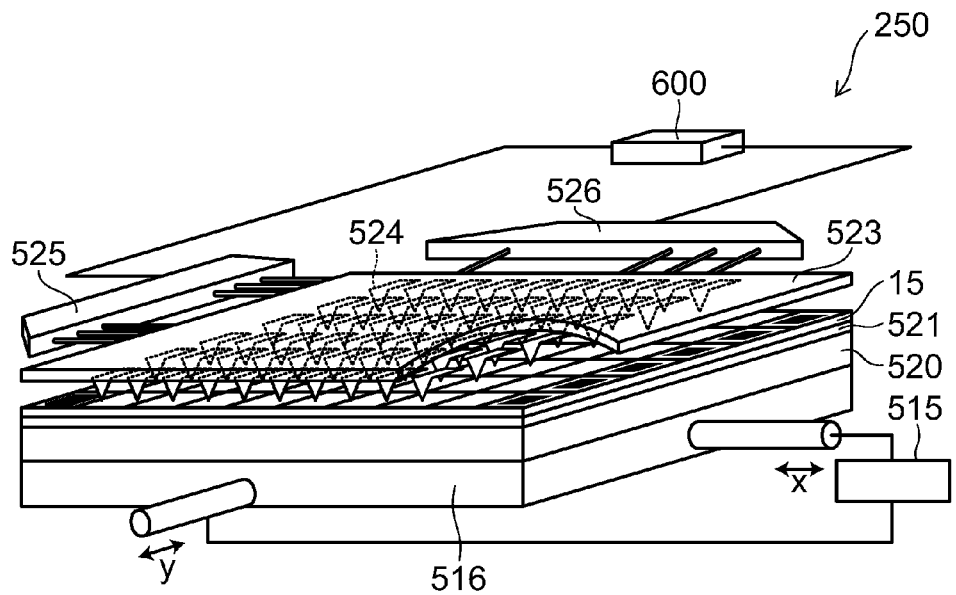
FIG. 11 is a schematic perspective view illustrating the configuration of a nonvolatile memory device according to a third embodiment.

FIG. 11 is a schematic perspective view illustrating the configuration of a nonvolatile memory device according to a third embodiment.

Figure 12:
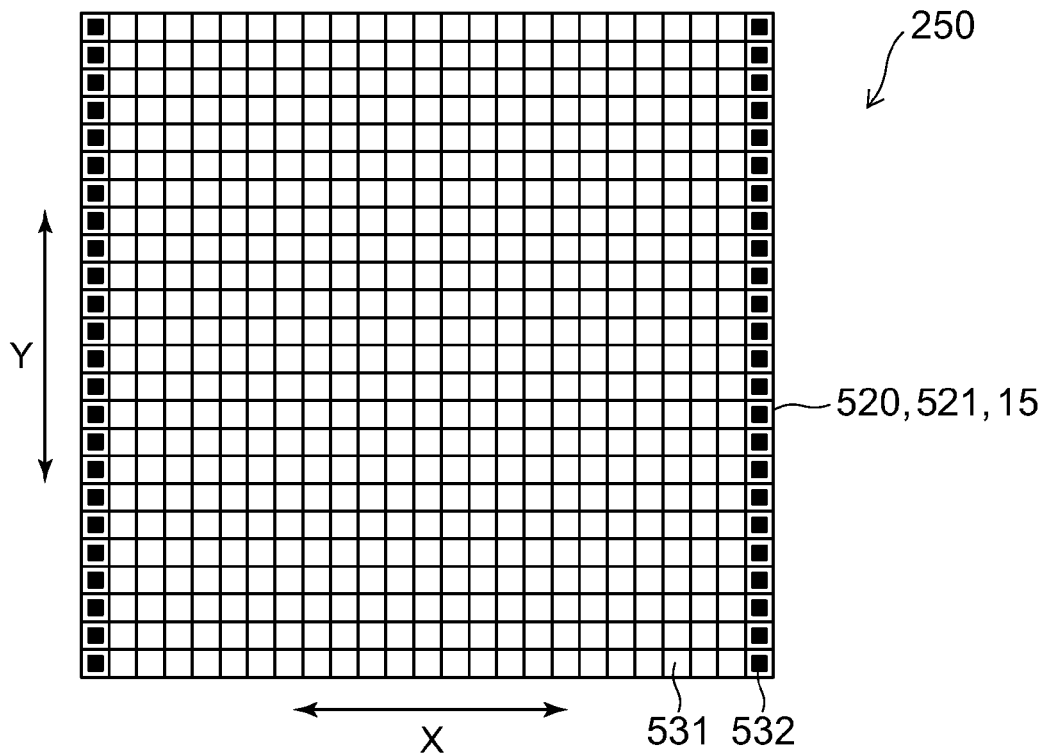
FIG. 12 is a schematic plan view illustrating the configuration of the nonvolatile memory device according to the third embodiment.

FIG. 12 is a schematic plan view illustrating the configuration of the nonvolatile memory device according to the third embodiment.

As shown in FIG. 11 and FIG. 12, a nonvolatile memory device 250 according to the embodiment includes a substrate 520, an electrode 521 provided on the substrate 520, and the memory layer 15 (a memory medium) provided on the electrode 521. The substrate 520 is provided on an XY scanner 516. A plurality of data areas 531 are provided in the memory layer 15. Servo areas 532 are provided at both ends in the X-axis direction of the data areas 531.

A probe array is disposed to oppose the memory layer 15.

The probe array includes, for example, a substrate 523 and a plurality of probes (heads) 524 disposed in an array configuration on one side of the substrate 523. A cantilever, for example, is used as the probe 524. The plurality of probes 524 are driven by multiplex drivers 525 and 526.

The plurality of probes 524 can be individually operated using a microactuator in the substrate 523. It is also possible to make all the probes 524 collectively perform the same operation to access the data areas 531 of the memory layer 15.

The electrode 521 is used as the first conductive unit 10, and the probe 524 is used as the second conductive unit 20, for example. In the case where the conductive protection layer 33B is provided on the memory layer 15, the protection layer 33B forms the second conductive unit 20.

All the probes 524 are reciprocated in the X direction with a constant period using the multiplex drivers 525 and 526 to read out the positional information in the Y direction from the servo areas 532 of the memory medium (the memory layer 15), for example. The positional information in the Y direction is transmitted to a driver 515.

The driver 515 drives the XY scanner 516 based on the positional information to move the memory layer 15 in the Y direction, and performs the positioning of the data areas 531 of the memory layer 15 and the probes 524.

When the positioning of both is completed, the writing, reading, or erasing of data is performed using the probes 524 on/above the data areas 531.

One probe (head) 524 is provided for one data area 531, and one probe 524 is provided for one servo area 532, for example. Each probe 524 is connected to a drive unit 600 via the multiplex drivers 525 and 526, for example. The drive unit 600 supplies at least one of a voltage and a current for information storage to each probe 524. The memory layer 15 transitions between the high resistance state and the low resistance state in accordance with the voltage and current applied via the probe 524. Furthermore, the drive unit 600 detects the high resistance state and the low resistance state stored in the memory layer 15 to read out stored information.

The nonvolatile memory device 250 thus configured includes the memory layer 15 and the drive unit 600 that produces a change in the memory layer 15 by at least one of applying a voltage to the memory layer 15 and passing a current through the memory layer 15 to store information. The nonvolatile memory device 250 further includes the probes 524 provided for the memory layer 15, and the drive unit 600 performs at least one of applying a voltage and passing a current on the memory units of the memory layer 15 via the probes 524. Thereby, a change is produced in the memory layer 15 to store information.

The drive unit 600 may include the driver 515 and the XY scanner 516 mentioned above, or conversely the drive unit may be included in the driver 515 and the XY scanner 516 mentioned above.

Also the nonvolatile memory device 250 of a probe memory type according to the embodiment can provide a nonvolatile memory device with high operational stability.

Fourth Embodiment

A nonvolatile memory device according to the embodiment has a flash memory configuration.

Figure 13:
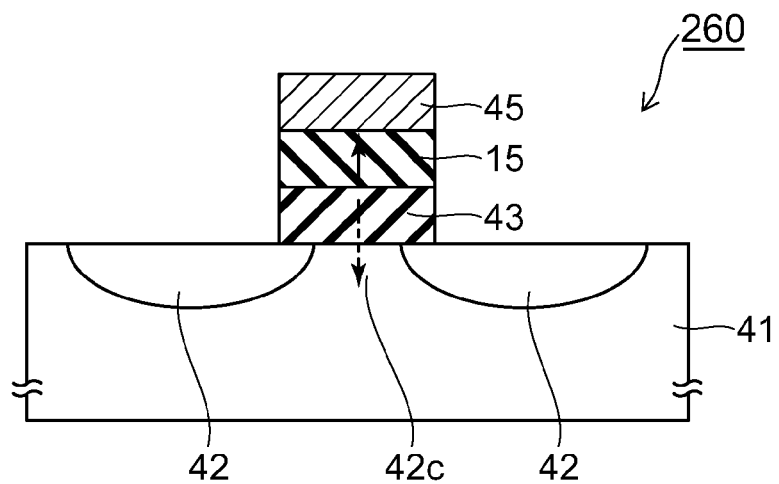
FIG. 13 is a schematic cross-sectional view illustrating the configuration of a nonvolatile memory device according to a fourth embodiment.

FIG. 13 is a schematic cross-sectional view illustrating the configuration of a nonvolatile memory device according to a fourth embodiment.

Figure 14:
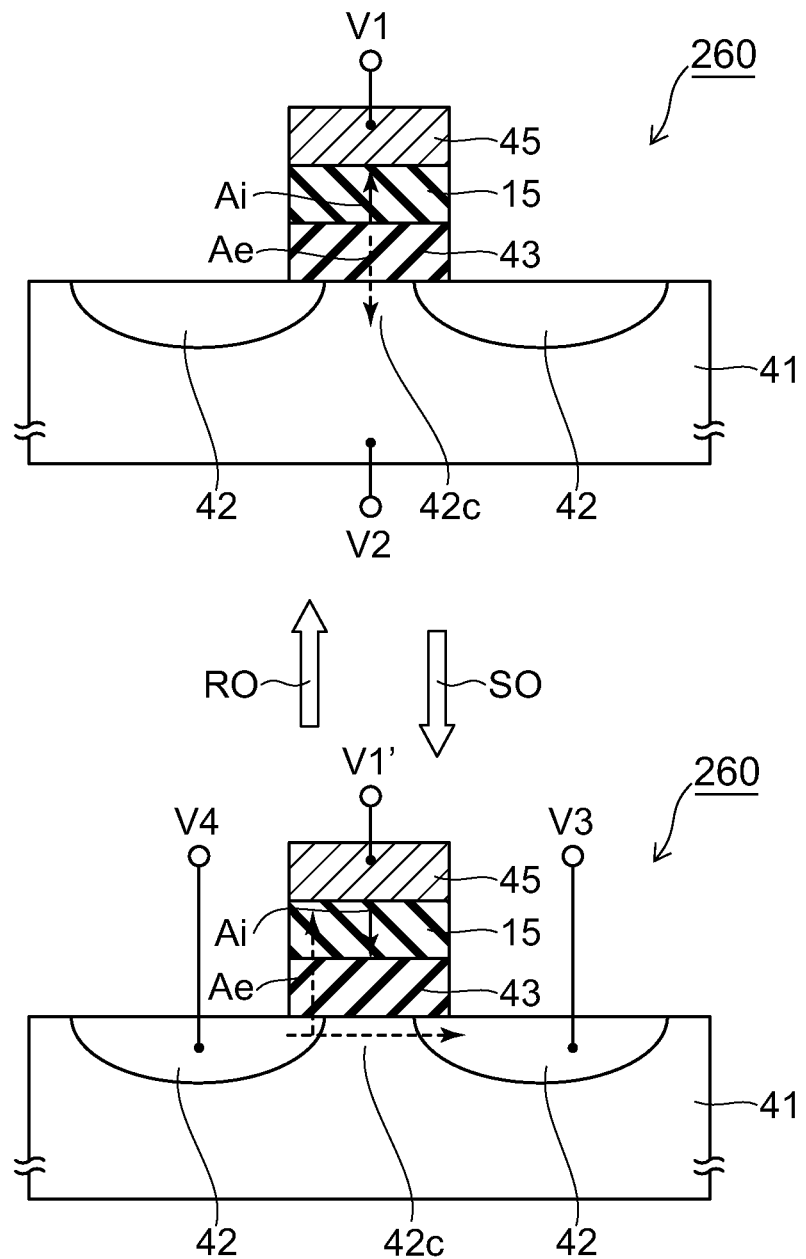
FIG. 14 is a schematic cross-sectional view illustrating operations of the nonvolatile memory device according to the fourth embodiment.

FIG. 14 is a schematic cross-sectional view illustrating operations of the nonvolatile memory device according to the fourth embodiment.

As shown in FIG. 13, a nonvolatile memory device 260 according to the embodiment includes a memory cell of a flash memory type. The memory cell has a configuration of a MIS (metal-insulator-semiconductor) transistor.

A plurality of diffusion layers 42 are formed in the surface region of a semiconductor substrate 41. A channel region 42c is provided between the plurality of diffusion layers 42. A gate insulating layer 43 is formed on the channel region 42c. The memory layer 15 according to the embodiment is formed on the gate insulating layer 43. A control gate electrode 45 is formed on the memory layer 15.

The memory layer 15 has the configuration described in the first embodiment. The channel region 42c may be taken as the first conductive unit 10, and the control gate electrode 45 may be taken as the second conductive unit 20, for example. The memory unit 22 including the first conductive unit 10, the second conductive unit 20, and the memory layer 15 may be provided between the gate insulating layer 43 and the control gate electrode 45. In the following drawings, the memory unit is shown to be omitted as the memory layer 15 as appropriate.

The semiconductor substrate 41 may be a well region. The semiconductor substrate 41 has a conductivity type opposite to the conductivity type of the diffusion layer 42. The control gate electrode 45 forms a word line. Conductive polysilicon, for example, is used for the control gate electrode 45.

In the embodiment, a not-shown drive unit is provided to be connected to the control gate electrode 45. The drive unit performs at least one of applying a voltage to the memory layer 15 and passing a current through the memory layer 15 via the control gate electrode 45.

As shown in FIG. 14, in the set (write) operation SO, an electric potential V1 is applied to the control gate electrode 45, and an electric potential V2 is applied to the semiconductor substrate 41.

The difference between the electric potential V1 and the electric potential V2 is a magnitude enough to change the memory layer 15, that is, change the resistance. However, the polarity of the potential difference is not limited in particular. That is, either V1>V2 or V1<V2 is possible.

For example, if it is assumed that the memory layer 15 is in the high resistance state HR in the initial state (reset state), the gate insulating layer 43 is thick, and therefore the threshold of the memory cell (MIS transistor) is high.

When the memory layer 15 is changed from this state to the low resistance state LR by applying the electric potentials V1 and V2, the gate insulating layer 43 becomes thin, and therefore the threshold of the memory cell (MIS transistor) becomes low.

Although the electric potential V2 was applied to the semiconductor substrate 41, instead the electric potential V2 may be transmitted from the diffusion layer 42 to the channel region 42c of the memory cell. In the drawing, the arrow Ae expresses the movement of electrons, and the arrow Ai expresses the movement of ions.

On the other hand, in the reset (erase) operation RO, an electric potential V1' is applied to the control gate electrode 45, an electric potential V3 is applied to one of the diffusion layers 42, and an electric potential V4 (<V3) is applied to the other of the diffusion layers 42. The electric potential V1' is set to a value exceeding the threshold of the memory cell in the set state At this time, the memory cell becomes ON, electrons flow from the other of the diffusion layers 42 toward the one, and hot electrons are generated. Since the hot electrons are injected into the memory layer 15 via the gate insulating layer 43, the temperature of the memory layer 15 increases.

Thereby, the memory layer 15 changes from the low resistance state LR to the high resistance state HR; therefore, the gate insulating layer 43 becomes thick, and the threshold of the memory cell (MIS transistor) becomes high.

Thus, the threshold of the memory cell can be changed by a similar principle to flash memory, and the device can be used as a nonvolatile memory device.

In the nonvolatile memory device 260 according to the embodiment, since the memory layer 15 described in regard to the first embodiment is used as the memory layer 15, a nonvolatile memory device with high operational stability can be provided.

Figure 15:
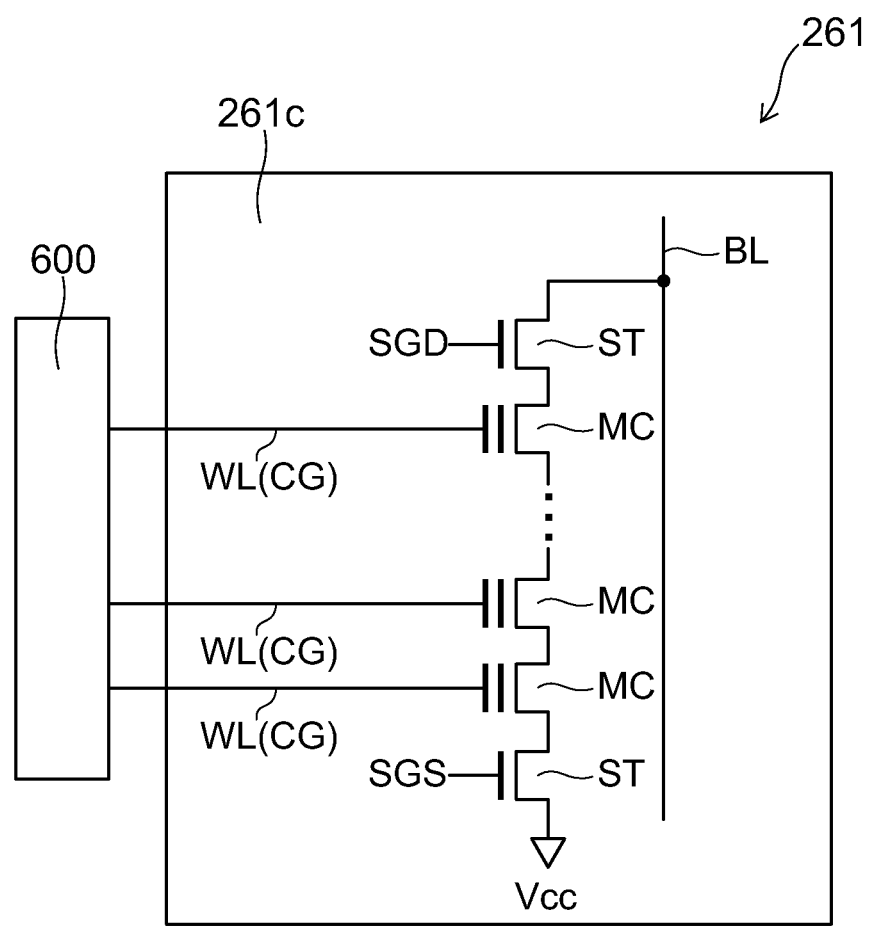
FIG. 15 is a schematic diagram illustrating the configuration of another nonvolatile memory device according to the fourth embodiment.

FIG. 15 is a schematic diagram illustrating the configuration of another nonvolatile memory device according to the fourth embodiment.

Figure 16A:
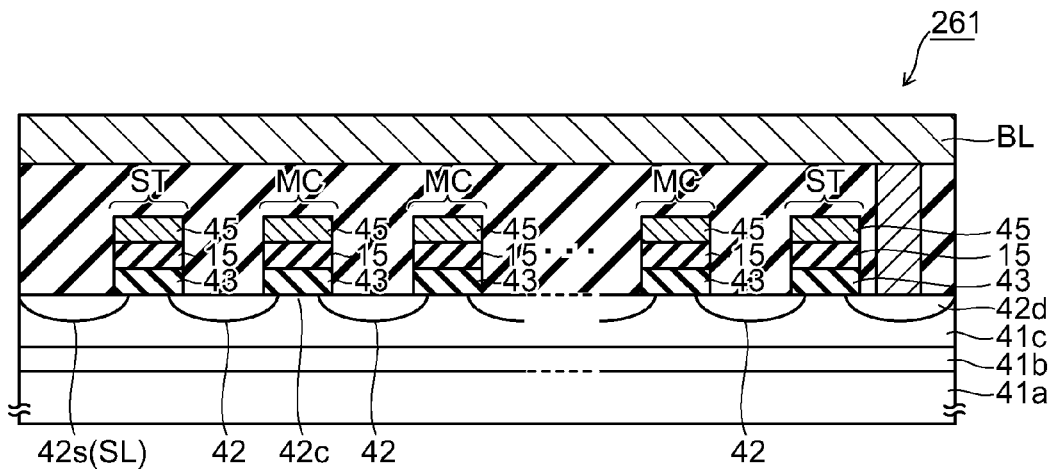
FIG. 16A to FIG. 16C are schematic cross-sectional views illustrating other nonvolatile memory devices according to the fourth embodiment.
Figure 16B:
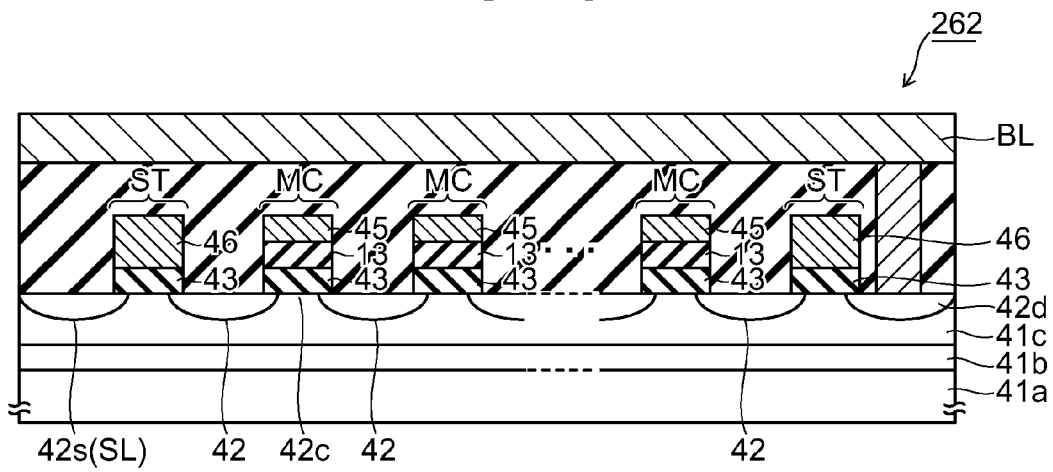
Figure 16C:
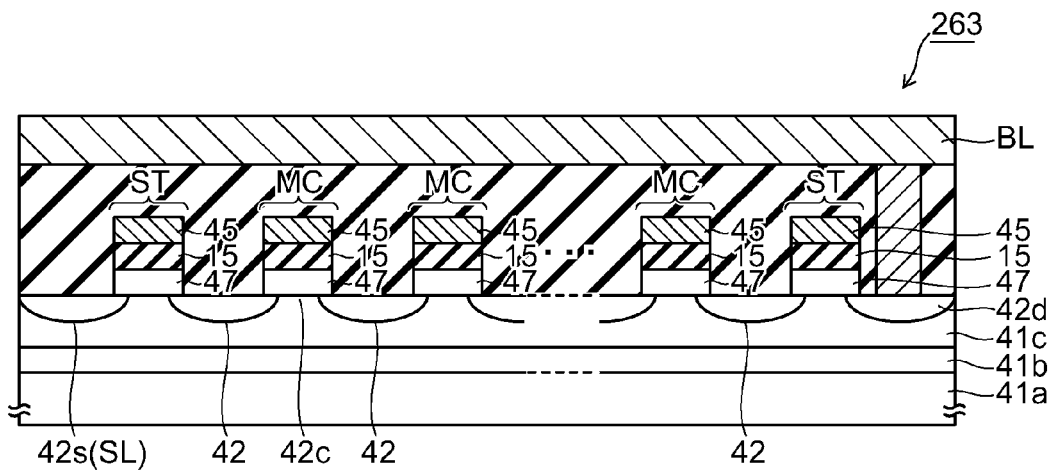

FIG. 16A to FIG. 16C are schematic cross-sectional views illustrating other nonvolatile memory devices according to the fourth embodiment.

Another nonvolatile memory device 261 according to the embodiment is a NAND flash memory. FIG. 15 shows a circuit diagram of a NAND cell unit 261c. FIG. 16A illustrates the structure of the NAND cell unit 261c.

As shown in FIG. 15, the NAND cell unit 261c includes a NAND string composed of a plurality of memory cells MC connected in series and a total of two select gate transistors ST connected to both ends of the NAND string one by one.

As shown in FIG. 16A, an n-type well region 41b and a p-type well region 41c are provided in a p-type semiconductor substrate 41a. The NAND cell unit 261c is formed in the p-type well region 41c.

In the example, the memory cell MC has the same structure as the select gate transistor ST. Specifically, these each include the n-type diffusion layers 42, the gate insulating layer 43 on the channel region 42c between the n-type diffusion layers 42, the memory layer 15 on the gate insulating layer 43, and the control gate electrode 45 on the memory layer 15.

As shown in FIG. 15, each control gate electrode 45 (CG) is electrically connected to the drive unit 600. The drive unit 600 may be provided in the substrate in which the NAND cell unit 261c is provided, or may be provided in a substrate different from the substrate.

The state (the high resistance state HR and the low resistance state LR) of the memory layer 15 of the memory cell MC can be changed by the operations described in regard to FIG. 14. In contrast, the memory layer 15 of the select gate transistor ST is fixed in the set state, that is, the low resistance state LR.

One of the select gate transistors ST is connected to a source line SL, and the other is connected to a bit line BL.

It is assumed that, before the set (write) operation SO, all the memory cells in the NAND cell unit 261c are in the reset state (resistance being large). The set (write) operation SO is performed successively from the memory cell MC on the source line SL side toward the memory cell on the bit line BL side one by one. V1 (a positive potential) is applied to the selected word line (control gate electrode) WL as a write potential, and $V_{pass}$ is applied to the not-selected word lines WL as a transmit potential (an electric potential at which the memory cell MC becomes ON). The select gate transistor ST on the source line SL side is switched to OFF, the select gate transistor ST on the bit line BL side is switched to ON, and program data is transmitted from the bit line BL to the channel region 42c of the selected memory cell MC.

For example, when the program data is "1", a write inhibit potential (e.g. an electric potential approximately equal to V1) is transmitted to the channel region 42c of the selected memory cell MC so that the resistance value of the memory layer 15 of the selected memory cell MC may not change from a high level to a low level.

Furthermore, when the program data is "0", V2 (<V1) is transmitted to the channel region 42c of the selected memory cell MC to change the resistance value of the memory layer 15 of the selected memory cell MC from a high level to a low level.

On the other hand, in the reset (erase) operation RO, for example, V1' is applied to all the word lines (control gate electrodes) WL to switch all the memory cells MC in the NAND cell unit 261c to ON. Furthermore, the two select gate transistors ST are switched to ON, V3 is applied to the bit line BL, and V4 (<V3) is applied to the source line SL.

At this time, since hot electrons are injected into the memory layers 15 of all the memory cells MC in the NAND cell unit 261c, the reset operation is performed collectively for all the memory cells MC in the NAND cell unit 261c.

In the read operation, a read potential (positive potential) is applied to the selected word line (control gate electrode) WL, and an electric potential at which the memory cell MC necessarily becomes ON irrespective of the data "0" or "1" is applied to the not-selected word lines (control gate electrodes) WL.

Furthermore, the two select gate transistors ST are switched to ON, and a read current is supplied to the NAND string.

Since the selected memory cell MC becomes ON or OFF in accordance with the value of the data stored therein when the read potential is applied, the data can be read out by, for example, detecting the change of the read current.

As shown in FIG. 16B, in another nonvolatile memory device 262 according to the embodiment, a common MIS transistor is used for the select gate transistor ST, without providing the memory layer 15. Thus, the structure of the select gate transistor ST is arbitrary.

As shown in FIG. 16C, in another nonvolatile memory device 263 according to the embodiment, the gate insulating layers of the plurality of memory cells MC constituting the NAND string are replaced with p-type semiconductor layers 47.

Figure 17:
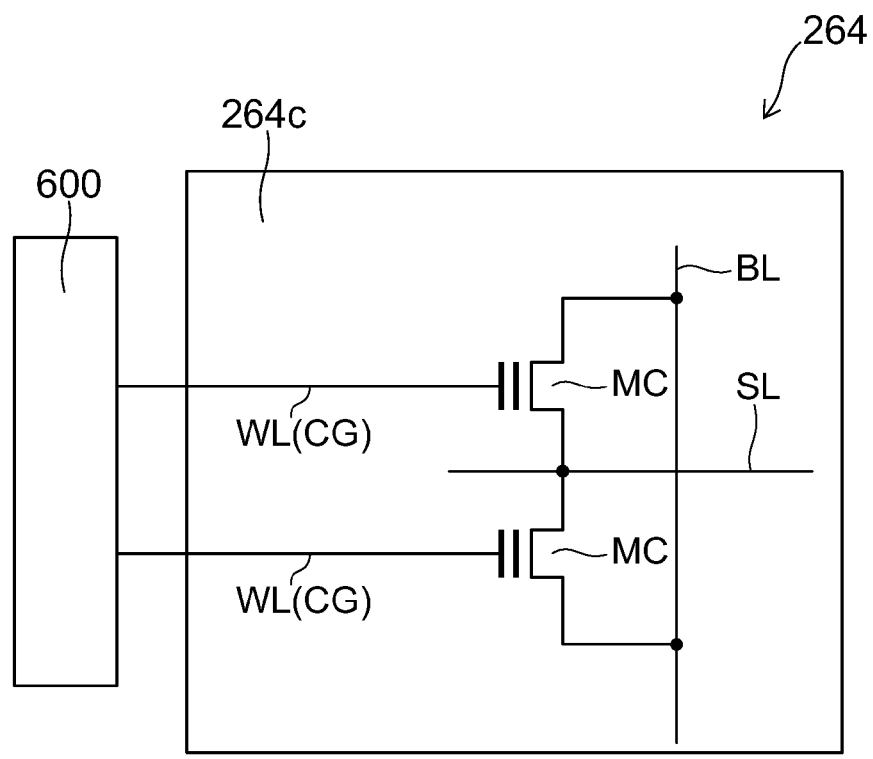
FIG. 17 is a schematic diagram illustrating the configuration of another nonvolatile memory device according to the fourth embodiment.

FIG. 17 is a schematic diagram illustrating the configuration of another nonvolatile memory device according to the fourth embodiment.

Figure 18:
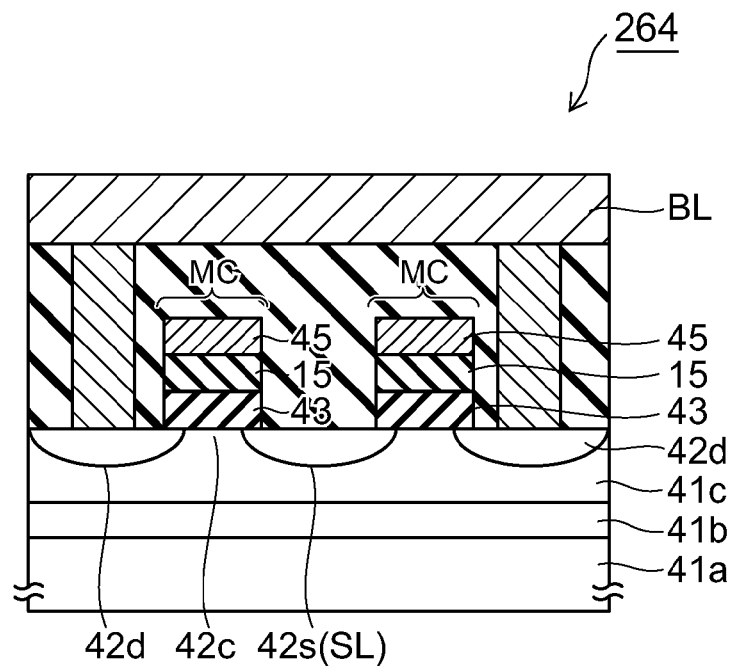
FIG. 18 is a schematic cross-sectional view illustrating the configuration of the other nonvolatile memory device according to the fourth embodiment.

FIG. 18 is a schematic cross-sectional view illustrating the configuration of the other nonvolatile memory device according to the fourth embodiment.

Another nonvolatile memory device 264 according to the embodiment is a NOR flash memory. FIG. 17 illustrates a circuit diagram of a NOR cell unit 264c. FIG. 18 illustrates the structure of the NOR cell unit 264c.

As shown in FIG. 18, the n-type well region 41b and the p-type well region 41c are formed in the p-type semiconductor substrate 41a. A NOR cell is formed in the p-type well region 41c. The NOR cell includes one memory cell (MIS transistor) MC connected between the bit line BL and the source line SL. The memory cell MC includes the n-type diffusion layers 42, the gate insulating layer 43 on the channel region 42c between the n-type diffusion layers 42, the memory layer 15 on the gate insulating layer 43, and the control gate electrode 45 on the memory layer 15.

As shown in FIG. 17, each control gate electrode 45 (CG) is electrically connected to the drive unit 600. The drive unit 600 may be provided in the substrate in which the NOR cell unit 264c is provided, or may be provided in a substrate different from the substrate. Also in the nonvolatile memory device 264, the operations described in regard to FIG. 14 are performed.

Figure 19:
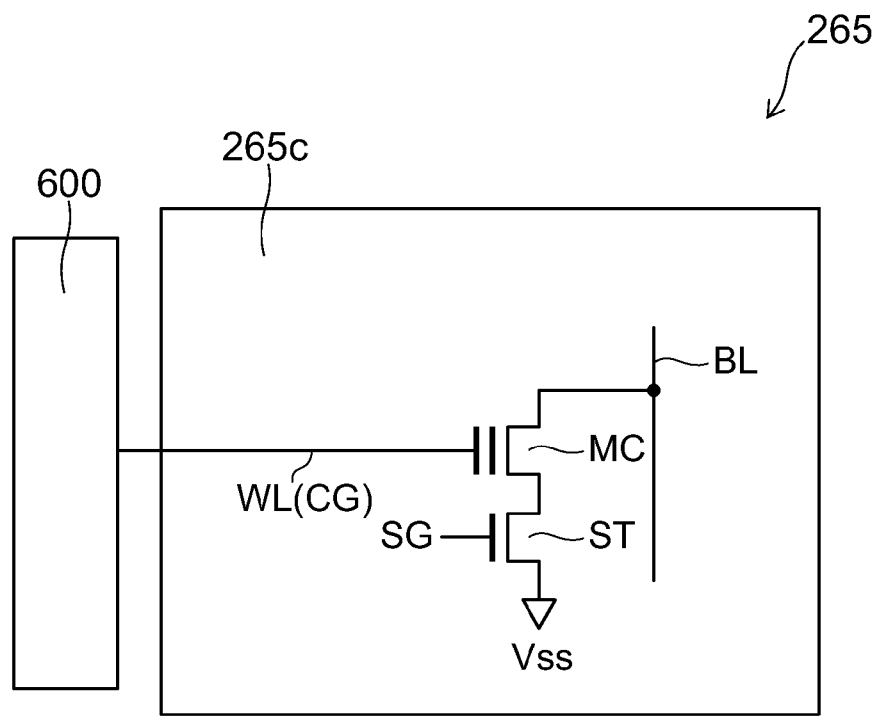
FIG. 19 is a schematic diagram illustrating the configuration of another nonvolatile memory device according to the fourth embodiment.

FIG. 19 is a schematic diagram illustrating the configuration of another nonvolatile memory device according to the fourth embodiment.

Figure 20:
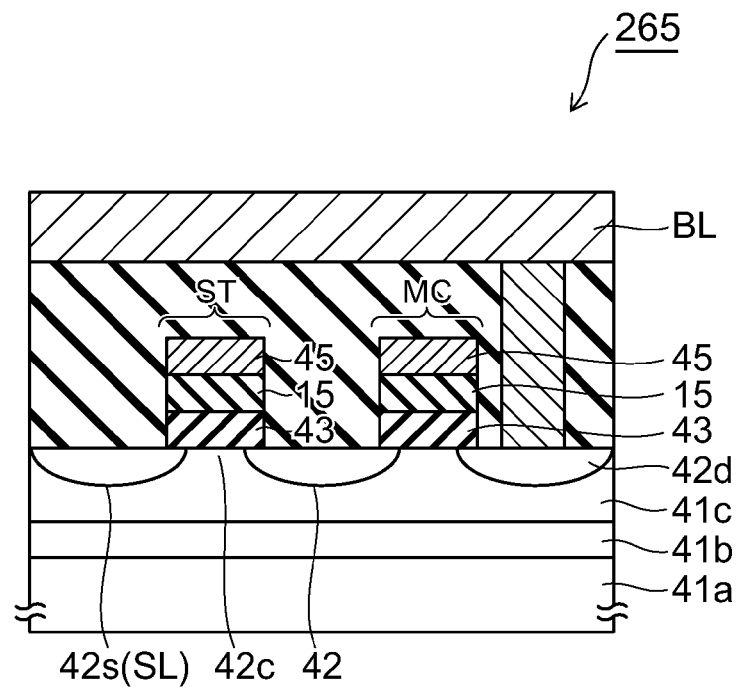
FIG. 20 is a schematic cross-sectional view illustrating the configuration of the other nonvolatile memory device according to the fourth embodiment.

FIG. 20 is a schematic cross-sectional view illustrating the configuration of the other nonvolatile memory device according to the fourth embodiment.

Another nonvolatile memory device 265 according to the embodiment is a two-transistor flash memory. FIG. 19 illustrates a circuit diagram of a two-transistor cell unit 265c. FIG. 20 illustrates the structure of the two-transistor cell unit 265c.

As shown in FIG. 19 and FIG. 20, the two-transistor cell unit 265c has a cell structure that has both the feature of the NAND cell unit and the feature of the NOR cell.

The n-type well region 41b and the p-type well region 41c are formed in the p-type semiconductor substrate 41a. The two-transistor cell unit 265c is formed in the p-type well region 41c.

The two-transistor cell unit 265c includes one memory cell MC and one select gate transistor ST connected in series. The memory cell MC has the same structure as the select gate transistor ST. Specifically, these each include the n-type diffusion layers 42, the gate insulating layer 43 on the channel region 42c between the n-type diffusion layers 42, the memory layer 15 on the gate insulating layer 43, and the control gate electrode 45 on the memory layer 15. The select gate transistor ST is connected to the source line SL, and the memory cell MC is connected to the bit line BL. Each control gate electrode 45 (CG) is electrically connected to the drive unit 600. The drive unit 600 may be provided in the substrate in which the two-transistor cell unit 265c is provided, or may be provided in a substrate different from the substrate. Also in the nonvolatile memory device 265, the operations described in regard to FIG. 14 are performed.

Figure 21:
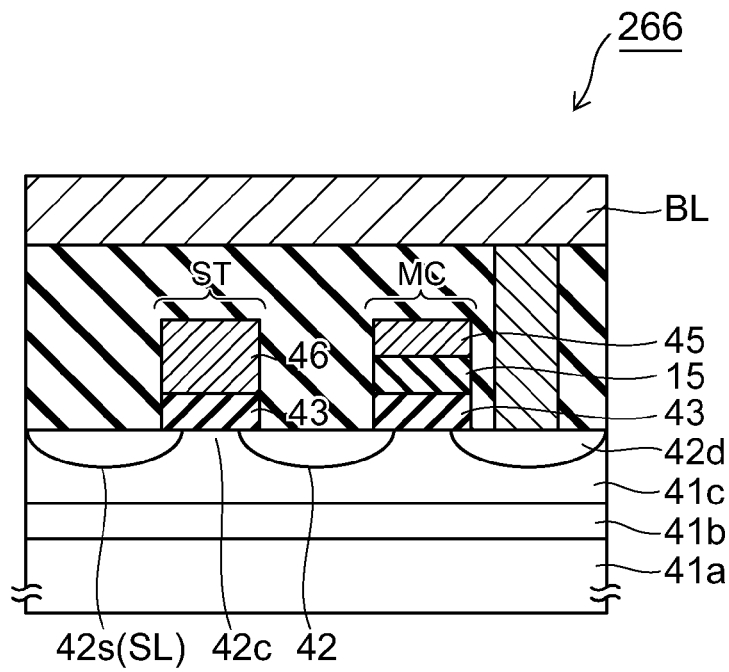
FIG. 21 is a schematic cross-sectional view illustrating the configuration of another nonvolatile memory device according to the fourth embodiment.

FIG. 21 is a schematic cross-sectional view illustrating the configuration of another nonvolatile memory device according to the fourth embodiment.

As shown in FIG. 21, in another nonvolatile memory device 266 according to the embodiment, a common MIS transistor is used for the select gate transistor ST, without providing the memory layer 15. Thus, the structure of the select gate transistor ST is arbitrary.

The nonvolatile memory device according to the embodiment may be used also for a memory medium.

Figure 22:
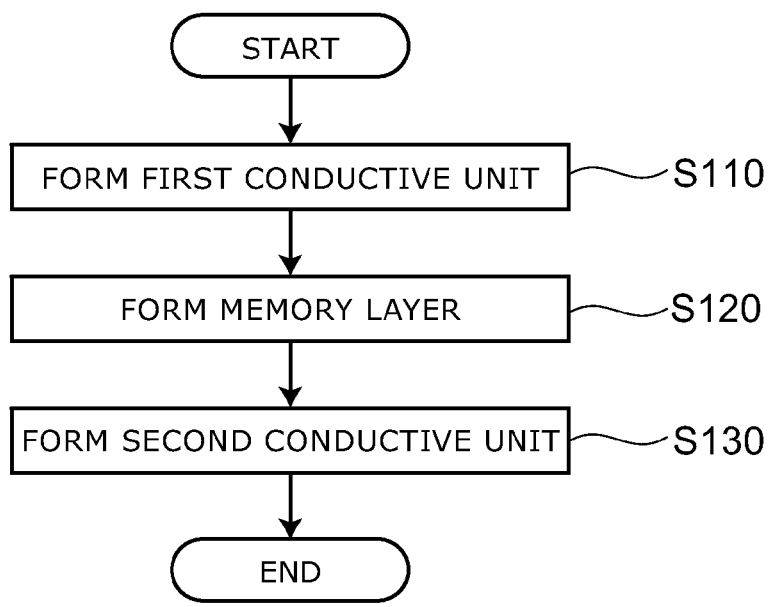
FIG. 22 is a flow chart illustrating a method for manufacturing a nonvolatile memory device according to the embodiment.

FIG. 22 is a flow chart illustrating a method for manufacturing a nonvolatile memory device according to the embodiment.

As shown in FIG. 22, the method for manufacturing the nonvolatile memory device 110 includes step S110 that forms the first conductive unit 10, step S120 that forms the memory layer 15 on the first conductive unit 10, and step S130 that forms the second conductive unit 20 on the memory layer 15.

In step S120, a material expressed by $(M1_{1-u}M2_u)_xX+y\alpha+z\beta$ is used for the memory layer 15.

In step S120, the memory layer 15 including the material mentioned above is crystallized. In the crystallization, at least one of $\alpha$ and $\beta$ is collected in the grain boundary portion CRb of the crystal CR.

The method for manufacturing the nonvolatile memory device 110 may further include a step that cleans the memory layer 15 between step S120 and step S130. That is, after the memory layer 15 is formed, the memory layer 15 is cleaned, and the second conductive unit 20 is formed on the cleaned memory layer 15. In the cleaning, part of $\alpha$ and $\beta$ collected in the grain boundary portion CRb is washed away. Therefore, when cleaning has been performed, the amount of $\alpha$ included in the memory layer 15 is smaller than the amount of $\alpha$ used in forming the memory layer 15. When cleaning has been performed, the amount of $\beta$ included in the memory layer 15 is smaller than the amount of $\beta$ used in forming the memory layer 15.

The embodiment can provide a nonvolatile memory device with high operational stability and a method for manufacturing the same.

Hereinabove, embodiments of the invention are described with reference to specific examples. However, the embodiment of the invention is not limited to these specific examples. For example, one skilled in the art may appropriately select specific configurations of components of nonvolatile memory devices such as first conductive units, second conductive units, memory layers, cation elements, and anion elements from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices and methods for manufacturing the same practicable by an appropriate design modification by one skilled in the art based on the nonvolatile memory devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
   a first conductive unit;
   a second conductive unit; and
   a memory layer provided between the first conductive unit and the second conductive unit and capable of reversibly transitioning between a first state and a second state due to a current supplied via the first conductive unit and the second conductive unit, a resistance of the second state being higher than a resistance of the first state;
   the memory layer including a material expressed by $(M1_{1-u}M2_u)_xX+y\alpha+z\beta$ (M1 and M2 include at least one selected from the group consisting of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln (a lanthanoid element), X includes at least one of O and N, $\alpha$ includes at least one of Li, Na, K, Rb, Cs, and Fr, $\beta$ includes at least one of F, Cl, Br, and I, $0.1 \leq x \leq 1.1$, $0.0001 \leq y \leq 0.2$, $0.9 \leq y/z \leq 1.1$).

2. The device according to claim 1, wherein
   the memory layer includes at least one kind of cation element and at least one kind of anion element,
   the at least one kind of cation element is a transition element having a d orbital partially filled with an electron(s), and
   an average shortest distance between adjacent cations of the cation element is 0.32 nm or less.

3. The device according to claim 1, wherein the memory layer has a crystal structure of one of a spinel structure, an ilmenite structure, a hollandite structure, a wolframite structure, a ramsdellite structure, a delafossite structure, an $\alpha$-NaFeO$_2$ structure, a LiMoN$_2$ structure, a fluorite structure, a rock salt structure, a rutile structure, and an anatase structure.

4. The device according to claim 1, wherein the memory layer includes a crystal and a concentration of the $\alpha$ in a grain boundary portion of the crystal is higher than a concentration of the $\alpha$ in a central portion of the crystal.

5. The device according to claim 1, wherein the memory layer includes a crystal and a concentration of the $\beta$ in a grain boundary portion of the crystal is higher than a concentration of the $\beta$ in a central portion of the crystal.

6. The device according to claim 1, wherein the $\alpha$ is Li and the $\beta$ is F.

7. The device according to claim 1, wherein the lanthanoid element includes at least one of La, Ce, Pr, Nd, Pm, Sm, Eu, Gd, Tb, Dy, Ho, Er, Tm, Yb, and Lu.

8. The device according to claim 1, wherein the X includes an alkali metal element and a halogen element in an amount of not less than 0.01% and not more than 20% of the number of anions.

9. The device according to claim 1, wherein a composition ratio u is not less than 0 and not more than 1.

10. The device according to claim 1, wherein the memory layer changes to the first state when an electric potential of the second conductive unit is made lower than an electric potential of the first conductive unit and changes to the second state when an electric potential of the second conductive unit is made higher than an electric potential of the first conductive unit.

11. The device according to claim 1, wherein
    the first conductive unit includes D1N and
    the D1 includes at least one selected from the group consisting of Ti, Zr, Hf, V, Nb, and Ta.

12. The device according to claim 1, wherein
    the first conductive unit includes D2O$_t$,
    the D2 includes at least one selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt, and
    a composition ratio t satisfies $1 \leq t \leq 4$.

13. The device according to claim 1, wherein
    the first conductive unit includes D3D4O$_3$,
    the D3 includes at least one selected from the group consisting of La, K, Ca, Sr, Ba, and Ln (a lanthanoid element), and the D4 includes at least one selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

14. The device according to claim 1, wherein
the first conductive unit includes $D5_2D6O_4$,
the D5 includes at least one selected from the group consisting of K, Ca, Sr, Ba, and Ln (a lanthanoid element), and
the D6 includes at least one selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

15. The device according to claim 1, further comprising:
a protection layer for protecting the second conductive unit, the second conductive unit being disposed between the memory layer and the protection layer; and
a heater layer for heating the memory layer, the heater layer being provided between the second conductive unit and the protection layer.

16. The device according to claim 1, further comprising:
a first interconnection electrically connected to the first conductive unit, the first conductive unit being disposed between the memory layer and the first interconnection; and
a second interconnection electrically connected to the second conductive unit, the second conductive unit being disposed between the memory layer and the second interconnection.

17. The device according to claim 16, wherein
the first conductive unit, the second conductive unit, the memory layer, the first interconnection, and the second interconnection are provided in plural,
the first interconnections extend in a first direction perpendicular to a stacking direction from the first conductive unit toward the second conductive unit and are aligned in a direction perpendicular to the stacking direction and the first direction,
the second interconnections extend in a second direction perpendicular to the stacking direction and nonparallel to the first direction and are aligned in a direction perpendicular to the stacking direction and the second direction, and
the first conductive units, the second conductive units, and the memory layers are arranged in intersection portions of the first interconnections and the second interconnections.

18. The device according to claim 17, further comprising a rectifying element provided between the first conductive unit and the first interconnection.

19. A method for manufacturing a nonvolatile memory device comprising:
forming a first conductive unit;
forming a memory layer on the first conductive unit using a material expressed by $(M1_{1-u}M2_u)_xX+y\alpha+z\beta$ (M1 and M2 include at least one selected from the group consisting of Mg, Al, Sc, Y, Ga, Ti, Zr, Hf, Si, Ge, Sn, V, Cr, Mn, Fe, Co, Ni, Cu, Zn, Nb, Ta, Mo, W, Ru, Rh, Ca, Sr, Ba, and Ln (a lanthanoid element), X includes at least one of O and N, $\alpha$ includes at least one of Li, Na, K, Rb, Cs, and Fr, $\beta$ includes at least one of F, Cl, Br, and I, $0.1 \leq x \leq 1.1$, $0.0001 \leq y \leq 0.2$, $0.9 \leq y/z \leq 1.1$), the memory layer being capable of reversibly transitioning between a first state and a second state, a resistance of the second state being higher than a resistance of the first state; and
forming a second conductive unit on the memory layer.

20. The method according to claim 19, further comprising cleaning the memory layer,
the forming the second conductive unit forming the second conductive unit on the cleaned memory layer.

* * * * *